(12) United States Patent
Park

(10) Patent No.: US 12,058,824 B2
(45) Date of Patent: Aug. 6, 2024

(54) DISPLAY DEVICE

(71) Applicant: Samsung Display Co., LTD., Yongin-si (KR)

(72) Inventor: Sang Hyo Park, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 59 days.

(21) Appl. No.: 17/698,436

(22) Filed: Mar. 18, 2022

(65) Prior Publication Data

US 2023/0041091 A1 Feb. 9, 2023

(30) Foreign Application Priority Data

Aug. 4, 2021 (KR) .......................... 10-2021-0102566

(51) Int. Cl.
*H05K 5/02* (2006.01)
*G06F 1/16* (2006.01)

(52) U.S. Cl.
CPC ......... *H05K 5/0217* (2013.01); *G06F 1/1624* (2013.01); *G06F 1/1652* (2013.01)

(58) Field of Classification Search
CPC .... H05K 5/0217; G06F 1/1652; G06F 1/1624
See application file for complete search history.

(56) References Cited

U.S. PATENT DOCUMENTS

| | | | |
|---|---|---|---|
| 9,964,995 B1* | 5/2018 | Morrison | H01Q 21/30 |
| 10,244,641 B2* | 3/2019 | Seo | H05K 5/0017 |
| 10,847,735 B2* | 11/2020 | Seo | G09F 9/301 |
| 10,893,621 B2* | 1/2021 | Qin | G09F 9/301 |
| 2015/0055287 A1* | 2/2015 | Seo | G06F 1/1681 |
| | | | 361/679.27 |
| 2015/0378391 A1* | 12/2015 | Huitema | H05K 1/183 |
| | | | 361/679.03 |
| 2018/0020556 A1* | 1/2018 | Seo | G06F 1/1641 |
| 2018/0242466 A1* | 8/2018 | Lee | G06F 1/1652 |
| 2018/0341293 A1* | 11/2018 | Kim | G06F 1/1652 |
| 2023/0179690 A1* | 6/2023 | Lv | G06F 1/1616 |
| | | | 455/566 |
| 2023/0221757 A1* | 7/2023 | Liu | G06F 1/1616 |
| | | | 361/679.01 |

FOREIGN PATENT DOCUMENTS

| | | |
|---|---|---|
| KR | 10-2016-0031363 | 3/2016 |
| KR | 10-2016-0114028 | 10/2016 |
| KR | 10-2018-0007739 | 1/2018 |
| KR | 10-2019-0143029 | 12/2019 |

* cited by examiner

*Primary Examiner* — Sagar Shrestha
(74) *Attorney, Agent, or Firm* — KILE PARK REED & HOUTTEMAN PLLC

(57) ABSTRACT

A display device includes a display panel comprising a first area and a second area located on a side of the first area in a first direction, a panel storage that accommodates the display panel therein, and a support module that supports a bottom of the display panel and assists a sliding operation of the display panel in the first direction. The support module comprises a first support member overlapping the first area, and a second support member overlapping the second area, the second support member comprising joints spaced apart from each other and spacers having an elastic modulus and disposed between the joints.

24 Claims, 30 Drawing Sheets

PNL: PNL_1, PNL_2, PNL_3, SBA
SP: SP_1, SP_2, SP_3

DISPLAY DEVICE

CROSS-REFERENCE TO RELATED APPLICATION(S)

This application claims priority to and benefits of Korean Patent Application No. 10-2021-0102566 under 35 U.S.C. § 119, filed on Aug. 4, 2021, in the Korean Intellectual Property Office, the entire contents of which are incorporated herein by reference.

BACKGROUND

1. Technical Field

The disclosure relates to a display device.

2. Description of the Related Art

Display devices have become more important as multimedia technology has evolved. Accordingly, a variety of types of display devices such as organic light-emitting display (OLED) devices and liquid-crystal display (LCD) devices are currently used.

Recently, as display technology evolves, research and development on display devices having a flexible displays have been ongoing. The display screen of a flexible display may be extended or reduced by folding, bending or sliding the display screen, thereby reducing the volume of the display screen and/or changing the design of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In order to support the lower portion of the flexible display of a sliding device, a multi-joint structure made of a metal material may be employed under the module. If a joint and an adjacent joint contact each other without a gap, stress generated by the multi-joint structure may be applied to the display panel, thereby causing defects.

Aspects of the disclosure provide a display device that may prevent defects on a display panel which may occur when stress is applied to the display panel caused by a multi joint structure having no gap between joints.

Objects of the disclosure are not limited to the above-mentioned object; and other objects of the disclosure will be apparent to those skilled in the art from the following descriptions.

According to an embodiment of the disclosure, it may be possible to prevent defects on a display panel which may occur when stress is applied to the display panel.

It should be noted that effects of the disclosure are not limited to those described above and other effects of the disclosure will be apparent to those skilled in the art from the following descriptions.

According to an embodiment of the disclosure, a display device may comprise a display panel comprising a first area and a second area located on a side of the second area in a first direction, a panel storage that accommodates the display panel therein; and a support module that supports a bottom of the display panel and assists a sliding operation of the display panel in the first direction. The support module may comprise a first support member overlapping the first area, and a second support member overlapping the second area, the second support member comprising joints spaced apart from each other and spacers having an elastic modulus and disposed between the joints.

The joints may comprise fixed ends attached to the bottom of the display panel, and free ends opposite to the fixed ends and not attached to the bottom of the display panel. The fixed ends may be spaced apart from each other at regular intervals. The free ends may be spaced apart from each other at regular intervals.

Each of the joints may extend in a second direction intersecting the first direction. A length of the spacers may be equal to a length of the joints in the second direction. The spacers are formed as a hollow tube having a circular cross section.

The spacers may include at least one of polyurethane, synthetic rubber and acrylic polymer.

An elastic modulus of the spacer may be in a range greater than about 2 MPa and less than about 3 GPa.

A display device may further comprise a spacer sealing member contacting the free ends and overlapping the display panel. The spacer sealing member and the joints may form housings, each of the housings may be a space between the spacer sealing member and the adjacent ones of the joints. The spacers may be disposed in the housings.

An elastic modulus of the spacer sealing member may be smaller than an elastic modulus of the spacer.

An elastic modulus of the spacer sealing member may be less than about 2 GPa.

Each of the joints may extend in a second direction intersecting the first direction. A length of the spacers may be equal to or greater than half of a length of the joints in the second direction, and may be less than the length of the joints in the second direction.

The spacers may be disposed in a middle portion of the joints in the second direction.

The display panel may further comprise a third area disposed on a side of the first area in the first direction, and a subsidiary area disposed at an end of the first area on a side in a second direction intersecting the first direction. The first area may be disposed between the second area and the third area. A driving circuit and a circuit board may be disposed on the subsidiary area. The support module further comprises a third support member overlapping the third area. The third support member may comprise joints spaced apart from each other, and spacers disposed between the joints and having an elastic modulus.

The support module may comprise an elastic member disposed between the display panel and the support module, a first adhesive member interposed between the display panel and the elastic member, the first adhesive member attaching the display panel to the elastic member, and a second adhesive member interposed between the elastic member and the first support member and between the elastic member and second support member, the second adhesive member attaching the elastic member to the first support member, and attaching the elastic member to the second support member.

An elastic modulus of the elastic member may be greater than the elastic modulus of the spacer.

According to an embodiment of the disclosure, a display device may comprise a display panel comprising a rigid area and a bendable area disposed adjacent to the rigid area in a first direction, joints attached to a bottom of the display panel and overlapping the bendable area, each of the joints extending in a second direction intersecting the first direction and spaced apart from each other, and spacers disposed on the bottom of the display panel. One or more of the spacers may be disposed between adjacent ones of the joints.

A display device may further comprise, a plane area, a round area disposed on a side of the plane area, and a panel storage overlapping at least a part of the plane area and at least a part of the round area. The panel storage may accommodate the display panel, the joints and the spacers. The rigid area of the display panel may be disposed on the plane area of the display device. At least a part of the bendable area of the display panel may be disposed in the round area to be bent. A distance between the joints overlapping the bendable area is reduced in case that the bendable area is bent, and the adjacent ones of the joints are spaced apart from each other by the one or more of the spacers disposed between the adjacent ones of the joints.

A part of the bendable area of the display panel may be disposed in the plane area of the display device. The bendable area disposed in the plane area of the display device may be flattened by the spacers.

A sum of lengths in the second direction of the one or more of the spacers disposed between the adjacent ones of the joints may be equal to or greater than a half of a length in the second direction of the joints and may be equal to or less than the length in the second direction of the joints.

According to an embodiment of the disclosure a display device may comprise a display panel, joints attached to a bottom surface of the display panel and spaced apart from each other, and a hollow tube disposed between the joints.

The joints may be spaced apart from each other by a first spacing. The hollow tube may have a cylindrical shape and may have a circular cross-section. A diameter of the circular cross-section of the hollow tube may be greater than the first spacing.

The hollow tube may include at least one of polyurethane, synthetic rubber and acrylic polymer.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
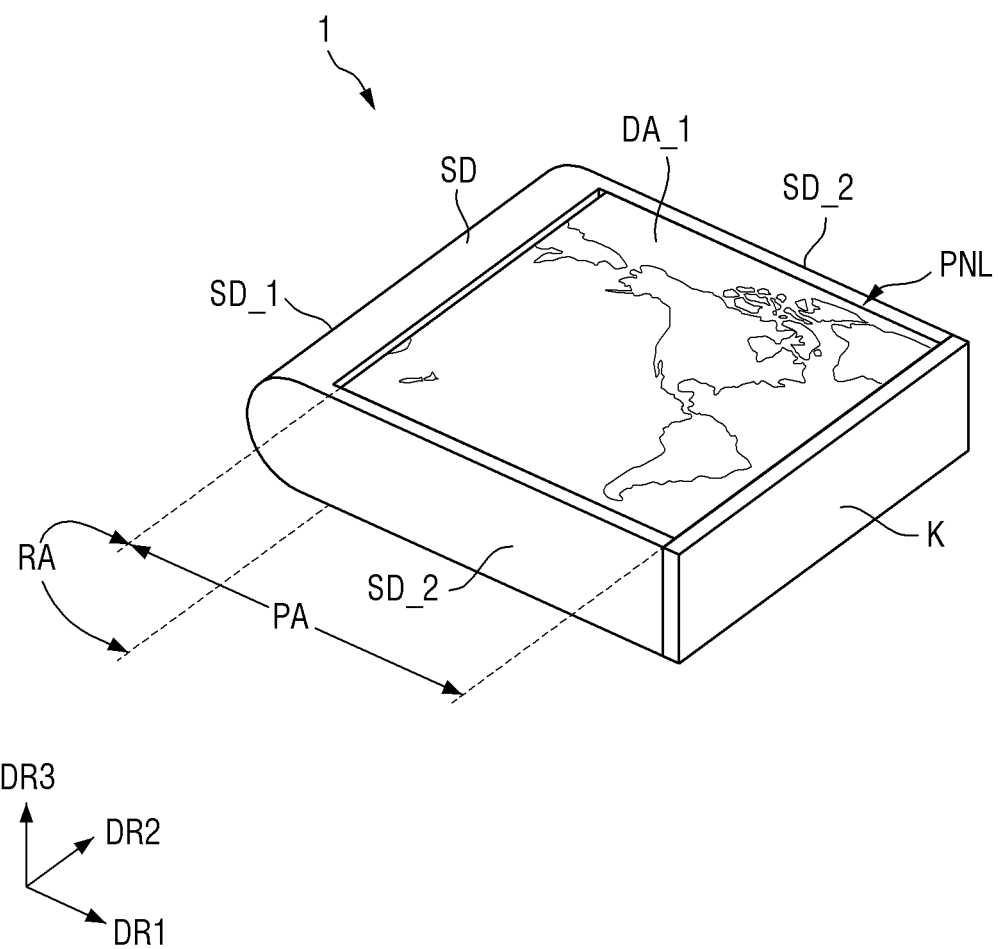
FIG. 1 is a schematic perspective view of a display device according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it may be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the scope of the disclosure. Similarly, the second element could also be termed the first element.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one" of is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to the accompanying drawings.

Figure 2:
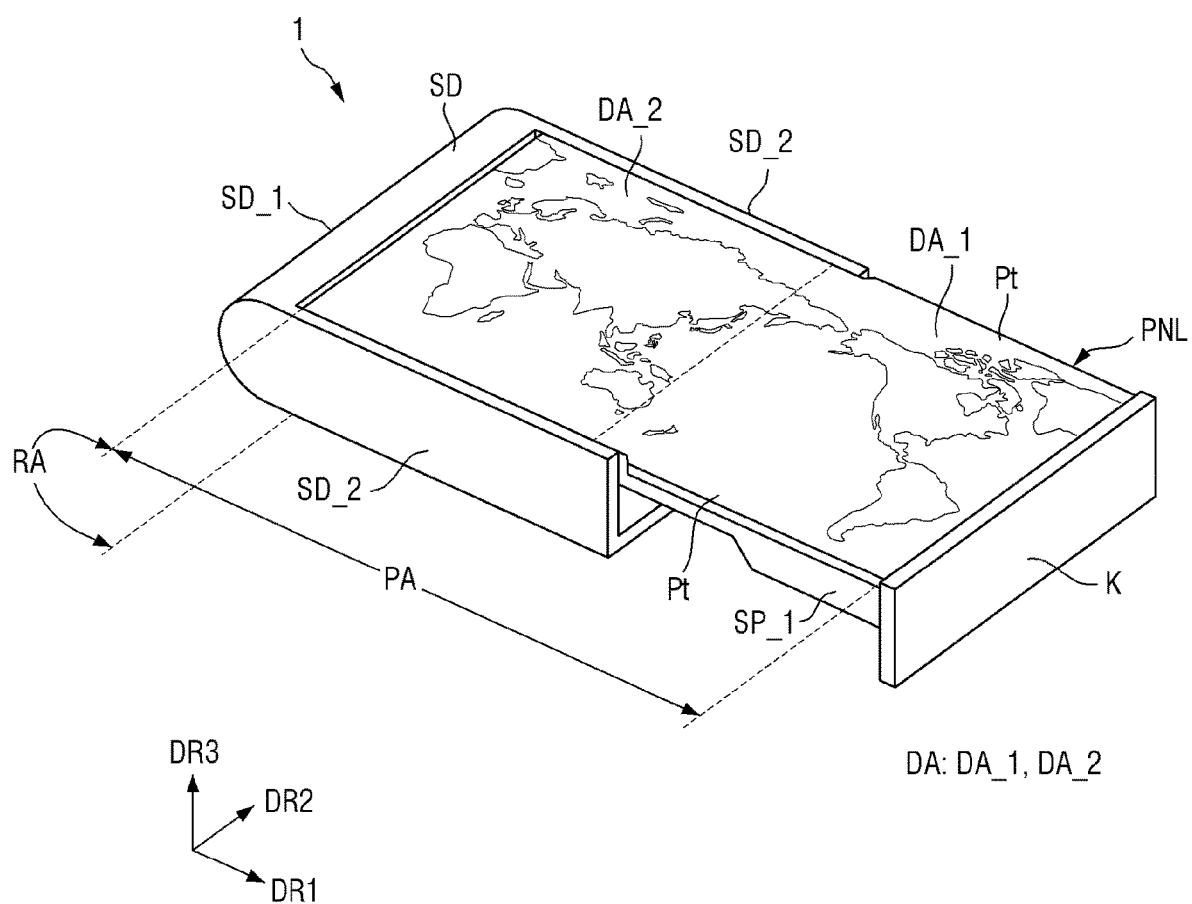
FIG. 2 is a schematic perspective view showing the display device of FIG. 1 when it is expanded.
Figure 3:
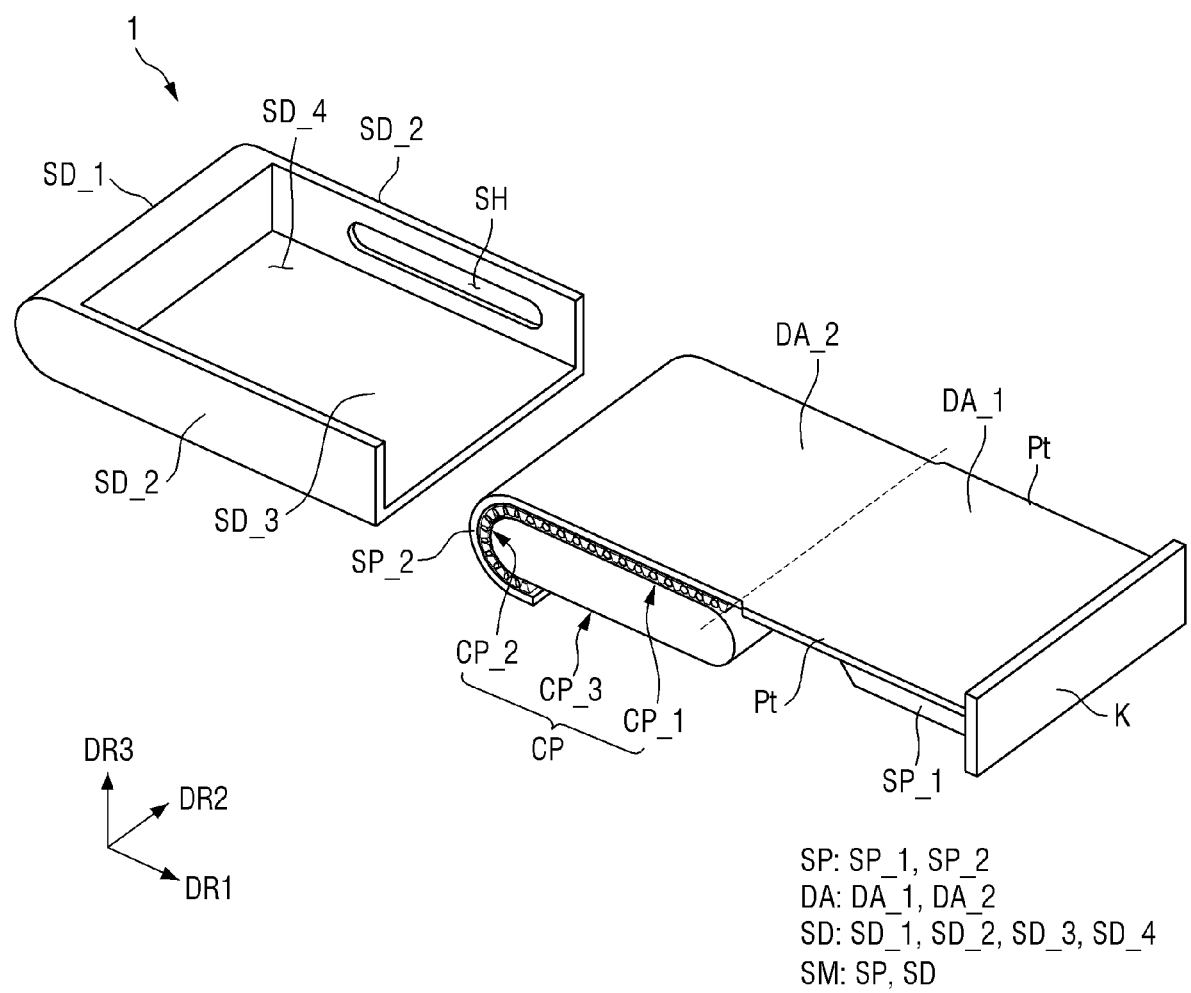
FIG. 3 is an exploded schematic perspective view of the display device shown in FIG. 1.
Figure 4:
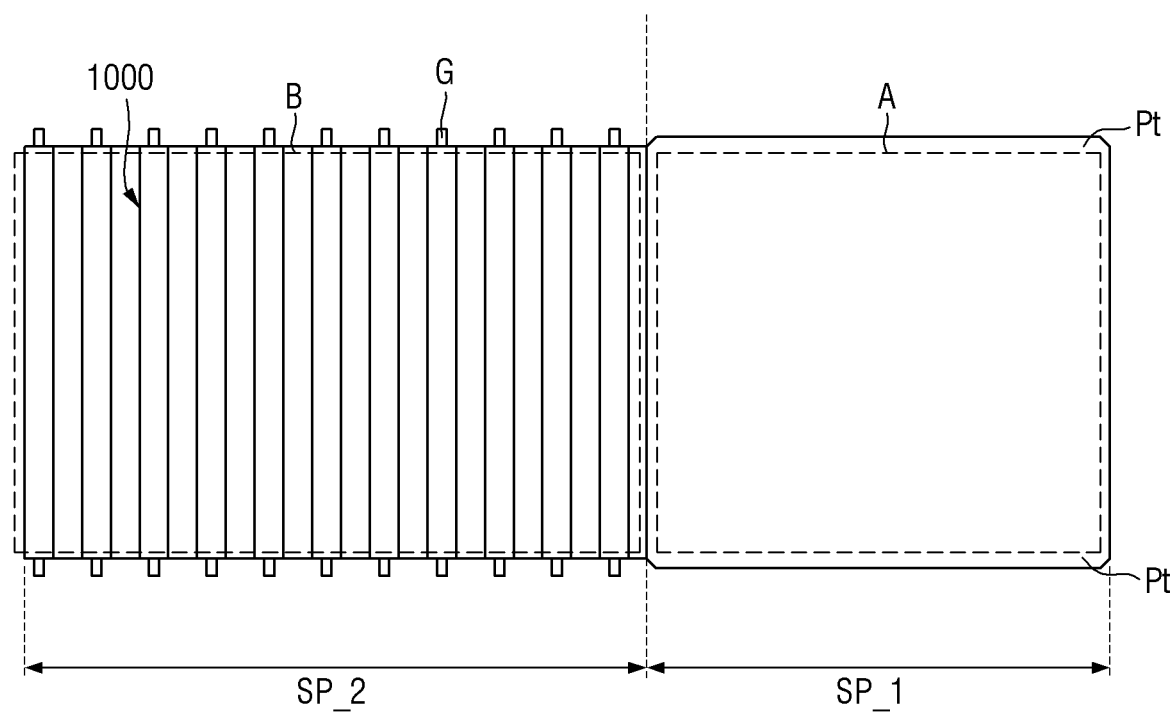
FIG. 4 is a schematic plan view showing a support module of FIG. 3 in the third direction DR3.
Figure 5:
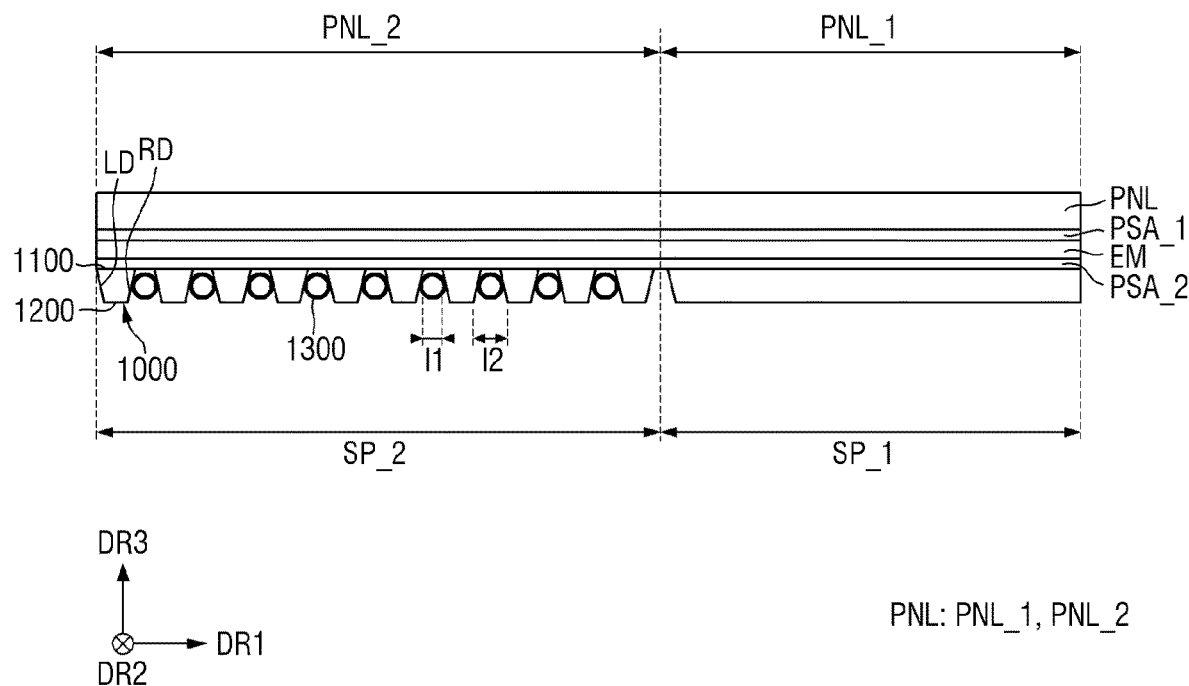
FIG. 5 is a schematic view showing a stack structure of a display panel and first and second support members of a display device according to an embodiment.

FIG. 1 is a schematic perspective view of a display device according to an embodiment of the disclosure. FIG. 2 is a schematic perspective view showing the display device of FIG. 1 when it is expanded. FIG. 3 is an exploded schematic perspective view of the display device shown in FIG. 1. FIG. 4 is a schematic plan view showing a support module of FIG. 3 in the third direction DR3. FIG. 5 is a schematic view showing a stack structure of a display panel and first and second support members of a display device according to an embodiment.

Referring to FIGS. 1 and 2, a display device 1 according to an embodiment may be a sliding display device or a slidable display device. The display device 1 may be, but is not limited to, a single slidable display device that slides in one direction. For example, the display device 1 may be a multi-slidable display device that slides in both directions. Hereinafter, the single-slidable display device will be mainly described, and the multi-slidable display device will be described below. The display device 1 may include a plane area PA and a round area RA. The plane area PA of the display device 1 generally overlaps with an open area SD_4 for exposing a display panel of a panel storage SD, which will be described below. The round area of the display device 1 may be located inside the panel storage SD. As shown in FIG. 2, the plane area PA may increase as the display device 1 expands.

Referring to FIGS. 1 to 5, the display device 1 may include a display panel PNL and a sliding module SM that assists the sliding operation of the display panel PNL.

The display panel PNL displays images. Any kind of display panel may be employed as the display panel PNL according to the embodiment, such as an organic light-emitting display panel including an organic light-emitting layer, a micro light-emitting diode display panel using micro LEDs, a quantum-dot light-emitting display panel using quantum-dot light-emitting diodes including quantum-dot light-emitting layer, and an inorganic light-emitting display panel using inorganic light-emitting elements including an inorganic semiconductor. In the following description, an organic light-emitting display panel is employed as the display panel PNL of the display device 1.

The display panel PNL may be a flexible panel. The display panel PNL may have flexibility so that it may be partially rolled, bent or curved in the panel storage SD of the sliding module, as will be described below.

The display device 1 has a three-dimensional shape. For example, the display device 1 may have a cuboid shape or a three-dimensional shape similar to it. In the drawing, a direction parallel to a first side (horizontal side) of the display device 1 is referred to as a first direction DR1, and a direction parallel to a second side (vertical side) of the display device 1 is referred to as a second direction DR2, and the thickness direction of the display device 1 is referred to as a third direction DR3. As used herein, a direction may refer to two directions toward a side and the opposite side unless specifically stated otherwise. If it is necessary to discern between two opposite directions, the side in one of the two directions may be referred to as "a side in the direction," while the opposite side in the two directions may be referred to as "the opposite side in the direction." In FIG. 1, the side indicated by the arrow of a direction is referred to as a side in the direction, while the opposite side is referred to as the opposite side in the direction. The first direction DR1 to the third direction DR3 may be perpendicular to each other. Based on the above-described directions, the display panel PNL may slide in the first direction DR1. The display panel PNL may display images on a side in the third direction DR3.

The display panel PNL may include a first area PNL_1 supported by a first support member SP_1 and a second area PNL_2 supported by a second support member SP_2, which will be described below. The first area PNL_1 of the display panel PNL may be always flat (for example, a rigid area) that maintains a flat shape regardless of the sliding operation. The second area PNL_2 of the display panel PNL may be either a curved area that is rolled, bent or curved, or a bendable area changing between a rolled, bent or curved shape and a flat shape according to the sliding operation.

The display area DA of the display panel PNL may be divided into a first display area DA_1 and a second display area DA_2 depending on whether and how long the display panel PNL slides in the first direction DR1. The presence of the second display area DA_2 may depend on whether the display panel PNL slides or not, and the area of the second display area DA_2 may depend on how long it slides. When the display panel PNL does not slide (hereinafter, referred to as a "basic display state"), it has the first display area DA_1 of a first area. When the display panel PNL slides, it includes the expanded second display area DA_2 in addition to the first display area DA_1.

In the second display area DA_2, the second area PNL_2 of the display panel PNL and the plane area PA may overlap each other.

The second display area DA_2 may increase depending on how long the display panel PNL slides in the first direction DR1. When the display device 1 slides to the maximum, the second display area DA_2 has a second area, and the display area DA has a third area which is the sum of the first area and the second area. The third area may be the maximum area of the display area DA.

The first display area DA_1 may overlap the first area PNL_1 of the display panel PNL. The second display area DA_2 may overlap at least a part of the second area PNL_2 of the display panel PNL. The boundary between the first display area DA_1 and the second display area DA_2 may coincide with the boundary between the first area PNL_1 and the second area PNL_2.

The sliding module SM accommodates the display panel PNL and assists the sliding operation of the display panel PNL. The sliding module SM may include the support module SP coupled to the bottom side of the display panel PNL, and the panel storage SD for accommodating at least a part of the display panel PNL.

The support module SP may include a first support member SP_1, a second support member SP_2 and spacers 1300. The first support member SP_1 and the second support member SP_2 may have substantially the same relative positional relationship with respect to the display panel PNL. When the display panel PNL is flat without bending, the first support member SP_1 and the second support member SP_2 may be on substantially a same plane, and that plane may be parallel to the display panel PNL.

Each of the first support member SP_1 and the second support member SP_2 may include a material having appropriate rigidity to support the display panel PNL, and may be made of, for example, metal. However, the disclosure is not limited thereto. The first support member SP_1 and the second support member SP_2 may be made of a material other than a metal. The first support member SP_1 and the second support member SP_2 may be made of either the same material or different materials.

The first support member SP_1 is disposed on a side of the second support member SP_2 in the first direction DR1.

The first support member SP_1 may have generally a plate shape in a plan view.

The first support member SP_1 includes a main area A overlapping the first area PNL_1 of the display panel PNL. The thickness of the first support member SP_1 may be uniform, but the first support member SP_1 may include an inclined portion becoming thinner toward the opposite side in the first direction DR1 as shown in FIG. 3.

The first support member SP_1 may further include protruding areas Pt protruding from the first area PNL_1 of the display panel PNL toward the both sides in the second direction DR2, respectively. The protruding areas Pt may be engaged with the side walls SD_2 of the panel storage SD, which will be described below, to guide the sliding movement of the display panel PNL. The thickness of the protruding areas Pt may be smaller than the thickness of the main area A, but the disclosure is not limited thereto.

The second support member SP_2 may be located on the opposite side of the first support member SP_1 in the first direction DR1, and may overlap the second area PNL_2 of the display panel PNL in area B shown in FIG. 4. The second support member SP_2 may be physically separated from the first support member SP_1 and spaced apart from it.

The second support member SP_2 may include joints 1000 and spacers 1300 disposed between the joints 1000. Each of the joints 1000 may have a shape that extends in the second direction DR2. As shown in FIG. 5, each of the joints 1000 may have a trapezoidal shape in which the cross-section becomes narrower toward the opposite side in the third direction DR3. All of the joints 1000 may have the same shape and size, but the embodiments are not limited thereto.

The joints 1000 of the second support member SP_2 may further include guide protrusions G protruding from the both ends in the second direction DR2. The guide protrusions G may protrude from the first area PNL_1 of the display panel PNL toward both of the sides in the second direction DR2 in a plan view.

The guide protrusions G may be engaged with the side walls SD_2 of the panel storage SD, similarly to the protruding areas Pt of the first support member SP_1, to guide the sliding movement of the display panel PNL. The length of the guide protrusions G protruding in the second direction DR2 from the edges of the display panel PNL may be substantially equal to the length of the protruding areas Pt of the first support member SP_1 protruding in the second direction DR2.

The joints 1000 may be arranged along the first direction DR1. Adjacent ones of the joints 1000 may be spaced apart from each other by a selected interval. The spacers 1300 each may be disposed in the space between adjacent joints 1000 of the second support member SP_2. The spacing between the adjacent joints 1000 and the spacers 1300 will be described in detail below.

The support module SP may further include an elastic member EM disposed between the display panel PNL and the support members. The elastic member EM may be fixed to the bottom of the display panel PNL and may mitigate stress applied to the display panel PNL. The elastic member EM may further absorb an impact applied to the display panel PNL.

The elastic member EM may be disposed across the first support member SP_1 and the second support member SP_2 in a plan view. The elastic member EM may be continuously extended regardless of the joints 1000 of the second support member SP_2 and the spacing between the joints 1000. The elastic member EM may have a shape substantially similar to the shape of the display panel PNL in a plan view.

The elastic member EM may be made of a material having an elastic modulus. For example, the elastic member EM may include, but is not limited to, polyurethane.

The elastic member EM may overlap the entire display panel PNL. When the display panel PNL is bent, the elastic member EM may also be bent together with the display panel PNL. When the elastic member EM is bent together with the display panel PNL, it may mitigate stress applied to the display panel PNL by absorbing stress generated when the second support member SP_2 is bent.

The support module SP may further include an adhesive member for fixing the support members SP_1 and SP_2 and/or the elastic member EM to the bottom of the display panel PNL. In the illustrated embodiment, the adhesive member includes a first adhesive member PSA_1 interposed (disposed) between the display panel PNL and the elastic member EM, coupling them, and a second adhesive member PSA_2 interposed (disposed) between the elastic member and both of the support members SP_1 and SP_2, coupling the support members SP_1 and SP_2 to the elastic member EM. The first adhesive member PSA_1 and the second adhesive member PSA_2 may have substantially the same shape as the elastic member EM in a plan view. The adhesive members PSA_1 and PSA_2 may be formed of a pressure sensitive adhesive (PSA). However, the embodiments of the disclosure are not limited thereto.

The joints 1000 of the second support member SP_2 may include the surfaces attached to the second adhesive member PSA_2 and the opposite surfaces. The movement of the surfaces of the joints 1000 attached to the second adhesive member PSA_2 is restricted by the second adhesive member PSA_2. The opposite surfaces of the joints 1000 are far away from the second adhesive member PSA_2, and thus they may have relatively free movement compared to the surfaces. In the following description, the surfaces of the joints 1000 attached to the second adhesive member PSA_2 will be referred to as fixed ends 1100, while the opposite surfaces will be referred to as free ends 1200 for convenience of illustration.

The free ends 1200 of the joints 1000 may have a length (or width) smaller than that of the fixed ends 1100. The joints 1000 may include inclined surfaces connecting the free ends 1200 with the fixed ends 1100. The inclined surfaces may include left inclined surfaces LD positioned on the opposite side in the first direction DR1 and right inclined surfaces RD positioned on the side in the first direction DR1. For example, the cross section of each of the joints 1000 may include a fixed end 1100, a free end 1200, a left inclined surface LD and a right inclined surface RD as shown in FIG. 5, and may have a trapezoidal shape that becomes narrower toward the opposite side in the third direction DR3. Although the cross section of the joints 1000 is shown as having an isosceles trapezoid in which the length of the left inclined surface LD is equal to the length of the right inclined surface RD, the cross-sectional shape of the joints 1000 is not limited to that shown in FIG. 5 as long as it has a shape becoming narrower toward the opposite side in the third direction DR3.

The adjacent joints 1000 may be equally spaced apart from each other. The fixed ends 1100 of the adjacent joints 1000 may be equally spaced apart from each other on the second adhesive member PSA_2. The adjacent joints 1000 may have the same fixed-end interval I1 defined as the distance between the fixed ends 1100. The free-end interval I2 may be defined as the distance between the free ends 1200. In the basic display state of the display device 1, the free-end interval I2 is greater than the fixed-end interval I1.

When the joints 1000 have a selected fixed-end interval I1, the range of motion of the joints 1000 may be expanded. If the fixed ends 1100 of the joints 1000 contact each other, they may have the free-end interval I2 but no fixed-end interval I1. The range of motion of the joints 1000 is limited during the sliding operation of the display device 1, and a strong local tensile stress may be applied to the area of the display panel PNL overlapping the portion where the fixed ends 1100 meet each other. As a result, there may occur defects on the display panel PNL. If the spacing between the adjacent joints 1000 is not uniform, the stress caused by the fixed-end intervals I1 between the adjacent joints 1000 may differ from position to position, such that the display quality of the display panel PNL may become generally non-uniform. In contrast, when adjacent joints 1000 is spaced apart from each other at equal spacing, such defects may be prevented.

The support module SP may further include a grip portion K. The grip portion K may be a handle for a user to slide the display panel PNL to expand the display area DA, and may also be a stopper that restricts the display panel PNL from sliding in the opposite side of the first direction DR1 in the basic display state. The grip portion K may be disposed at an end of the first support member SP_1 in the first direction DR1. The grip portion K may be attached to the first support member SP_1 or the first support member SP_1 and the grip portion K may be integral with each other.

The grip portion K may have a flat plate shape extended in the second direction DR2, but the disclosure is not limited thereto. The width of the grip portion K in the second direction DR2 may be greater than the width of the display panel PNL in the second direction DR2. The grip portion K may protrude from the display panel PNL toward the both sides in the second direction DR2. Therefore, in the basic display state as shown in FIG. 1, the grip portion K fits with the ends of the side walls SD_2 of the panel storage SD to be described below in the first direction DR1, so that the display panel PNL may be stably fixed without sliding in the opposite side in the first direction DR1.

The panel storage SD serves to accommodate at least partially the display panel PNL and the support module SP.

The panel storage SD includes a lower surface SD_3 and side walls SD_1 and SD_2. The lower surface SD_3 of the panel storage SD forms the bottom surface of the panel storage SD. The side walls SD_1 and SD_2 are extended from the edges of the lower surface SD_3 toward one side in the third direction DR3. According to the embodiment of the disclosure, the side walls SD_1 and SD_2, and the lower surface SD_3 may be integral with each other, and may have a shape bent in the vertical direction from the lower surface SD_3, but the disclosure is not limited thereto.

The side walls SD_1 and SD_2 may include a rear wall SD_1 located on the edge of the lower surface SD_3 on the opposite side in the first direction DR1 (the vertical side extended parallel to the second direction DR2), and a pair of side walls SD_2 located on both of the edges of the lower surface SD_3 in the second direction DR2 (two horizontal sides extended parallel to the first direction DR1). The rear wall SD_1 and the side walls SD_2 may be integral with each other, but the disclosure is not limited thereto.

No sidewall may be disposed at the edge of the lower surface SD_3 on the side in the first direction DR1. An open space is provided at the edge of the lower surface SD_3, and the display panel PNL may move in and out through the open space.

The panel storage SD may include the open area SD_4 having the open top in the third direction DR3. The display area DA of the display panel PNL accommodated in the panel storage SD may be exposed through the open area SD_4 so that a user may see it. The open area SD_4 may be defined as an area surrounded by the rear wall SD_1 and the side walls SD_2.

The panel storage SD may include an empty space surrounded by the rear wall SD_1, the side walls SD_2 and the lower surface SD_3. The display panel PNL, a part of the support module SP and a panel driving module CP, which will be described below, may be disposed in the empty space formed in the panel storage SD and accommodated in the panel storage SD.

Each of the pair of side walls SD_2 of the panel storage SD may include a sliding groove SH formed in the inner surface thereof. The protruding areas Pt of the first support member SP_1 and the guide protrusions G of the second support member SP_2 may be fitted into the sliding groove SH of the panel storage SD. When the display panel PNL slides toward a side or the opposite side in the first direction DR1 on the panel driving module CP, the first support member SP_1 or the second support member SP_2 slides along the trajectory formed by the sliding groove SH, and accordingly the sliding movement of the display panel PNL may be guided. Although a side of the sliding groove SH is covered by the side wall SD_2 in the drawings, the sliding groove SH may be replaced with a sliding hole penetrating the side wall SD_2 in the second direction DR2.

The display device 1 may further include the panel driving module CP for driving the display panel PNL. The panel driving module CP may provide a display driving signal to the display panel PNL and supply power to the display device 1. The panel driving module CP may include a hardware assembly in which panel driving components such as a circuit board and a battery pack are packaged together so as to supply signals to the display panel PNL.

The panel driving module CP may have a three-dimensional shape, and the both side surfaces in the first direction DR1 may have convex surfaces and the other surfaces may have flat surfaces. The panel driving module CP may include a front portion CP_1 having a flat surface and disposed on a side in the third direction DR3, a rear portion CP_3 having a flat surface and disposed on the opposite side in the third direction DR3, and connection portions CP_2 connecting the front portion CP_1 with the rear portion CP_3. The connection portion CP_2 located on the opposite side of the panel driving module CP in the first direction DR1 may have a curved surface convex toward the opposite side in the first direction DR1. The connection portion CP_2 located on a side of the panel driving module CP in the first direction DR1 may have a curved surface convex toward a side in the first direction DR1.

The panel driving module CP may be accommodated in the panel storage SD such that it is surrounded by the rear wall SD_1, the side walls SD_2 and the lower surface SD_3 of the panel storage SD, with the front portion CP_1, the rear portion CP_3 and the connection portions CP_2 surrounded by the display panel PNL.

When the panel driving module CP is accommodated in the panel storage SD, the panel storage SD and the panel driving module CP may not contact each other, but a certain gap or space may be formed between the driving module CP and the panel storage SD. For example, the rear wall SD_1 of the panel storage SD and the connection portion CP_2 of the panel driving module CP may face each other with a gap or space between them. The lower surface SD_3 of the panel storage SD and the rear portion CP_3 of the panel driving module CP may face each other with the distance or space therebetween, and the front portion CP_1 of the panel driving module CP may face the open area SD_4 of the panel storage SD. At least a part of the display panel PNL and at least a part of the support module SP may be accommodated in the space formed between the panel storage SD and the panel driving module CP.

The display panel PNL and the support module SP may be at least partially disposed on the panel driving module CP. For example, the display panel PNL and the support module SP are mounted on the panel driving module CP and may slide toward both sides in the first direction DR1. They may be selectively accommodated in the panel storage SD as they slide along the connection portions CP_2, the rear portion CP_3 and the front portion CP_1 of the panel driving module CP. For example, as shown in FIG. 3, the display panel PNL and the support module SP may be accommodated in the panel storage SD such that they surround the front portion CP_1, the connection portions CP_2 and the rear portion CP_3 of the panel driving module CP.

The sliding groove SH formed in the side wall SD_2 of the panel storage SD may form a trajectory conforming to the shape of the panel driving module CP when the display device 1 is viewed in the second direction DR2, as shown in FIG. 3. Accordingly, the display panel PNL may slide along the trajectory conforming to the shape of the panel driving module CP. Hereinafter, the sliding movement of the display panel PNL, the supporting the display panel PNL by the support module SP and the way of displaying images by the display panel PNL will be described in detail in terms of the mounting relationship between the panel storage SD and the support module SP.

As shown in FIG. 1, when the display device 1 is in the basic display state, only the first area PNL_1 of the display panel PNL is exposed through the open area SD_4, and an image may be displayed on the first display area DA_1 (i.e., the first area PNL_1) corresponding to the first area PNL_1. In this state, the first support member SP_1 may support the lower portion of the display panel PNL on the front portion CP_1 of the panel driving module CP, and the second support member SP_2 may support the lower portion of the curved display panel PNL on the connection portion CP_2 of the panel driving module CP. For example, the shape of the second support member SP_2 may conform to the shape of the connection portion CP_2 (the curved surface convex toward the opposite side in the first direction DR1) as some of the joints 1000 of the second support member wrap around the connection portion CP_2 and some of the joints 1000 are disposed below the rear portion CP_3. The panel storage SD may store the second area PNL_2 of the display panel PNL inside the panel storage SD when the display panel PNL is not expanded.

When the sliding operation is performed as shown in FIG. 2, the display panel PNL is supported by the first support member SP_1 and slides toward a side in the first direction DR1 on the panel storage SD. Accordingly, the display device 1 may be expanded toward a side in the first direction DR1. In this state, at least a part of the second area PNL_2 of the display panel PNL may be moved so that it is located between the front portion CP_1 of the panel driving module CP and the open area SD_4 of the panel storage SD. The second area PNL_2 of the display panel PNL may be exposed to the outside through the open area SD_4 as well as the first display area DA_1, i.e., the first area PNL_1. In this sliding state, the display device 1 may display an image through the first display area DA_1 as well as the second display area DA_2. The first support member SP_1 may support the lower portion of the first area PNL_1 of the display panel PNL on the outside of the panel storage SD, and the second support member SP_2 may support the lower portion of the second area PNL_2 of the display panel PNL on the front portion CP_1 and the connection portion CP_2 of the panel driving module CP.

Hereinafter, a multi-slidable display device will be described with a focus on the differences from the above-described single-slidable display device.

Figure 6:
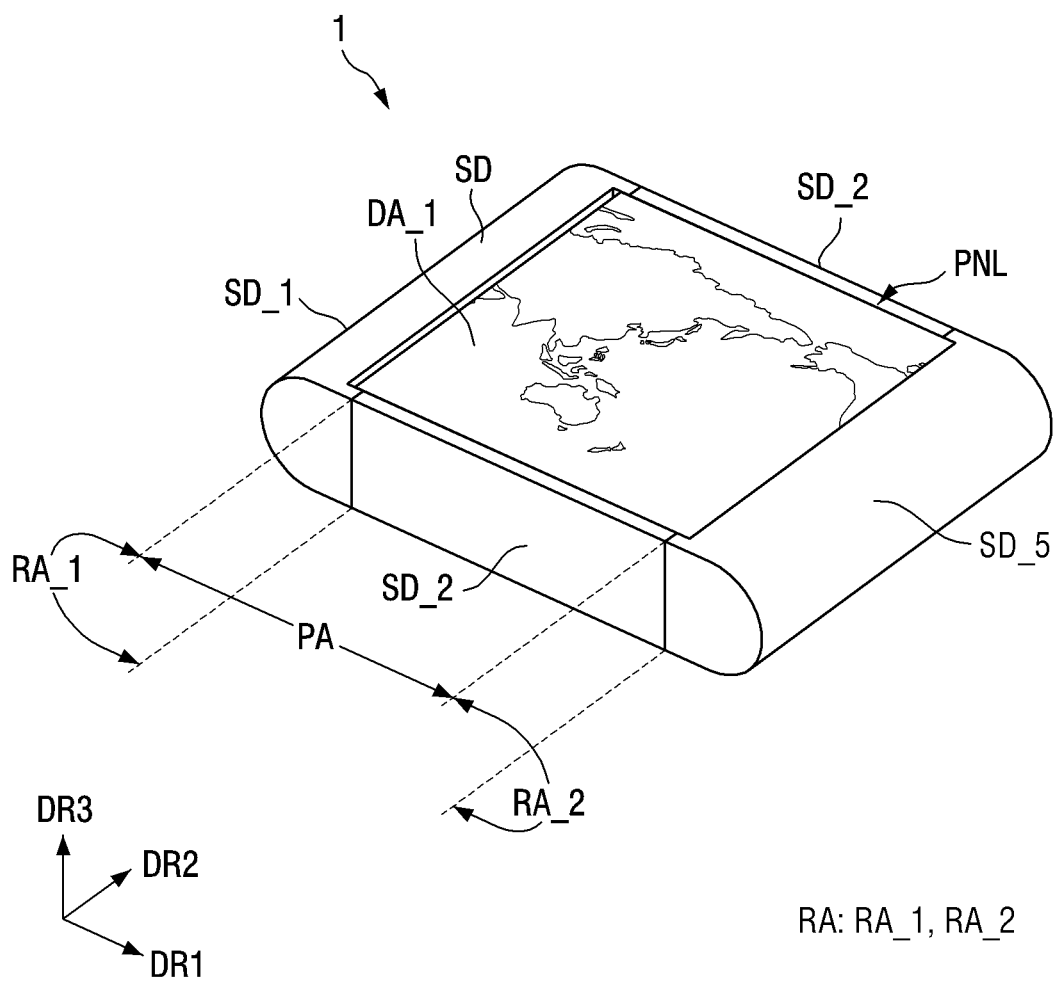
FIG. 6 is a schematic perspective view of a display device according to an embodiment of the disclosure.
Figure 7:
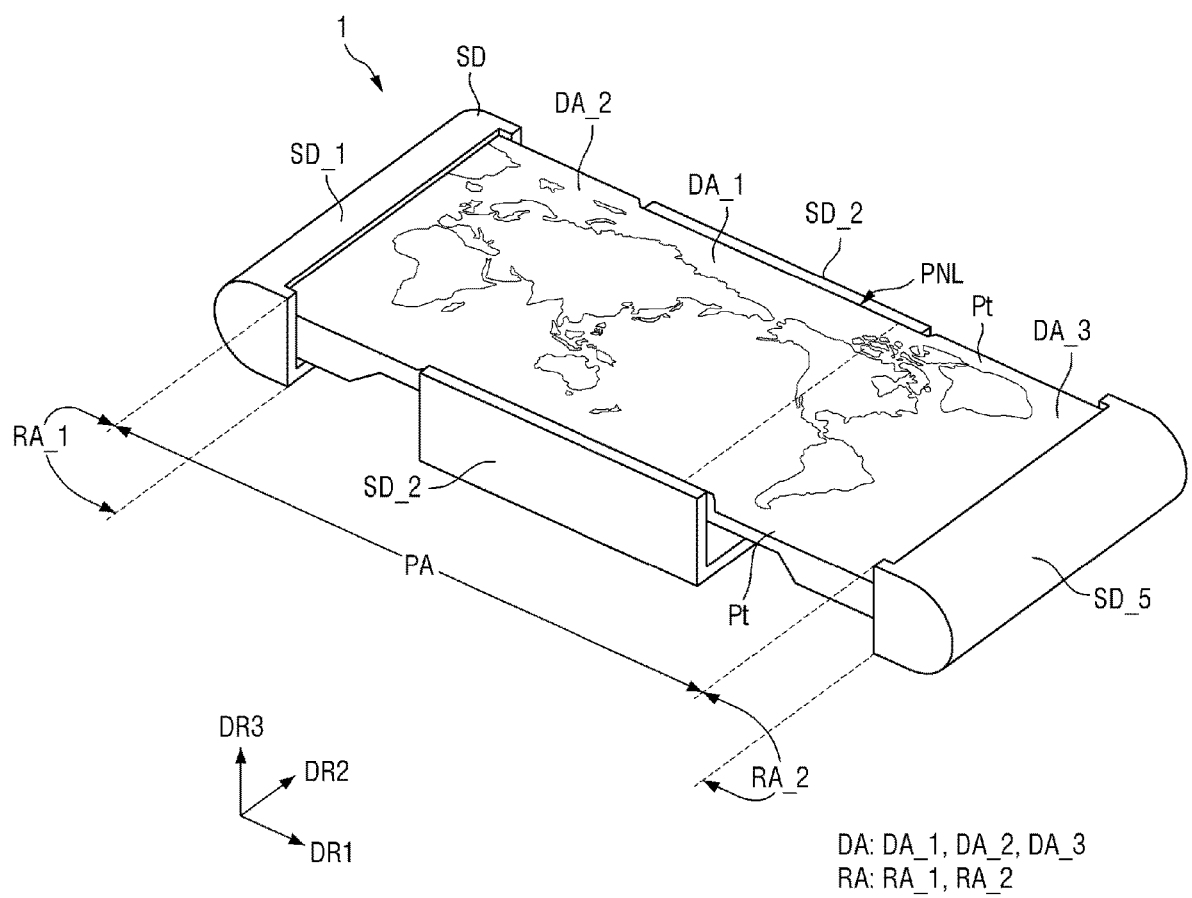
FIG. 7 is a schematic perspective view showing the display device of FIG. 6 when it is expanded.
Figure 8:
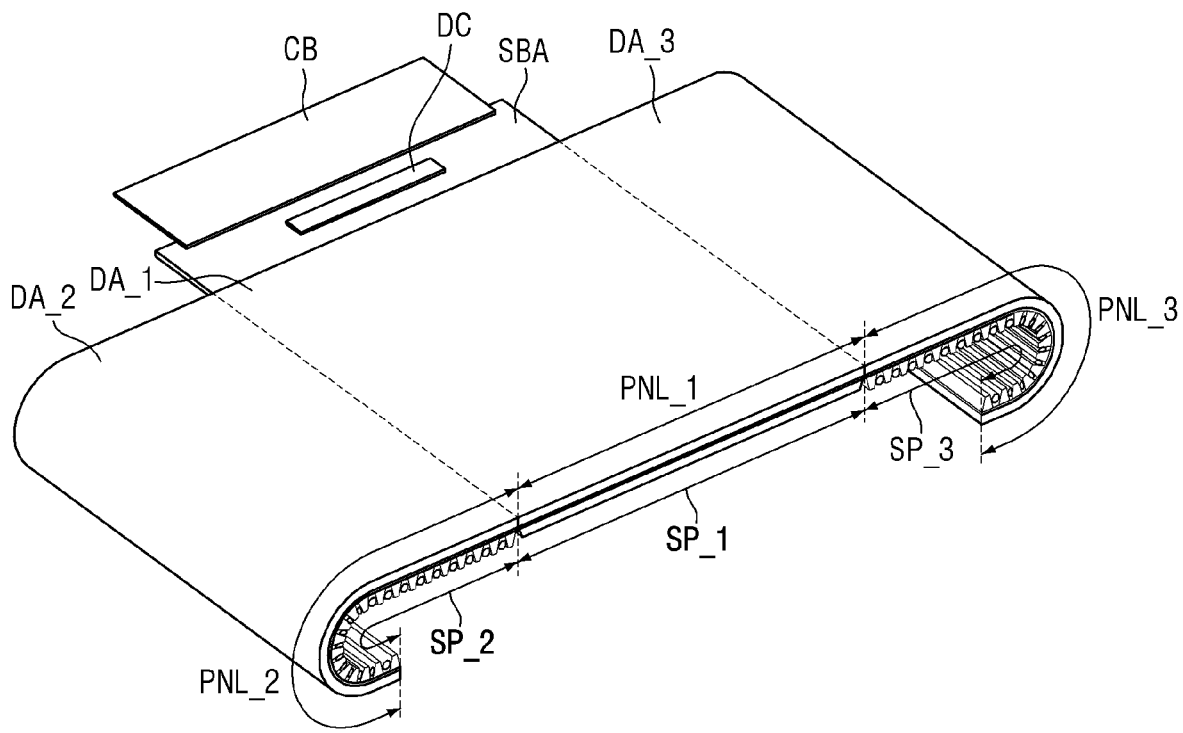
FIG. 8 is a schematic perspective view showing an arrangement of a display panel and a support module of the display device of FIG. 6.
Figure 9:
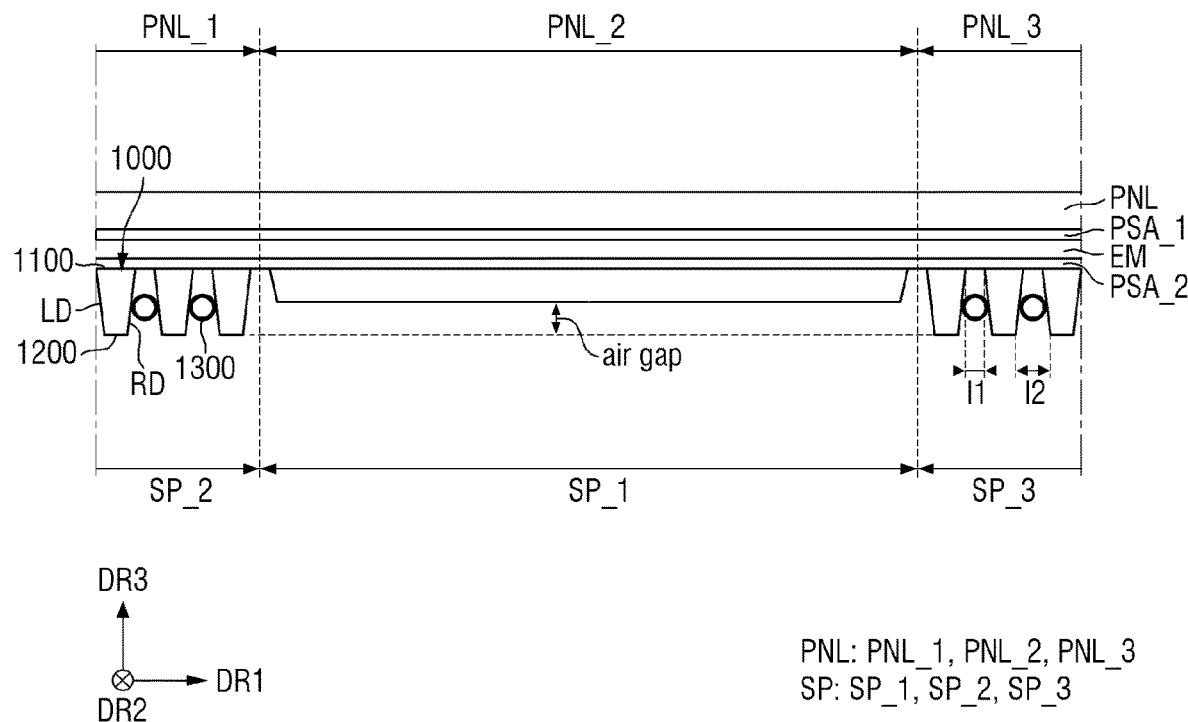
FIG. 9 is a schematic view showing a stack structure of the display panel and the support modules of the display device of FIG. 6.

FIG. 6 is a schematic perspective view of a display device according to an embodiment of the disclosure. FIG. 7 is a schematic perspective view showing the display device of FIG. 6 when it is expanded. FIG. 8 is a schematic perspective view showing an arrangement of a display panel and a support module of the display device of FIG. 6. FIG. 9 is a schematic view showing a stack structure of the display panel and the support modules of the display device of FIG. 6.

Referring to FIGS. 6 and 7, a display device 1 according to an embodiment may be a multi-slidable display device that may slide in two directions. The display device 1 may include a plane area PA and round areas RA. The round areas RA may be disposed on both sides of the plane area PA in the first direction DR1, respectively. A first round area RA_1 may be disposed on a side of the plane area PA in the opposite of the first direction DR1 while a second round area RA_2 may be disposed on the opposite side of the plane area PA from the first round area RA_1 in the first direction DR1. As shown in FIG. 7, the plane area PA may increase as the display device 1 expands.

Referring to FIGS. 8 and 9, a display panel PNL includes a first area PNL_1 supported by a first support member SP_1 and a second area PNL_2 supported by a second support member SP_2, and may further include a third area PNL_3 supported by a third support member SP_3 to be described below. The first area PNL_1 of the display panel PNL may be an always flat area (for example, a rigid area) that maintains a flat shape regardless of the sliding operation. Each of the second area PNL_2 and the third area PNL_3 of the display panel PNL may be either a curved area that is rolled, bent or curved, or a bendable area changing between a rolled, bent or curved shape and a flat shape according to the sliding operation. The second area PNL_2 and the third area PNL_3 may be symmetrical to each other, with the first area PNL_1 disposed between them. The third area PNL_3 may be disposed on a side of the first area PNL_1 in the first direction DR1, and the second area PNL_2 may be disposed on the opposite side of the first area PNL_1 in the first direction DR1.

The display panel PNL may further include a subsidiary area. The subsidiary area SBA may be disposed on a side of the first area PNL_1 of the display panel PNL in the second direction DR2. The subsidiary area SBA may be a folded, curved or bent. When the subsidiary area SBA is bent, the subsidiary area SBA may overlap the first area PNL_1 in the third direction DR3. The subsidiary area SBA may have, but is not limited to, a rectangular shape in a plan view.

The length of the subsidiary area SBA in the first direction DR1 may be substantially equal to the length of the first area PNL_1 in the first direction DR1. In other examples, the length of the subsidiary area SBA in the first direction DR1 may be smaller than the length of the first area PNL_1 in the first direction DR1. The length of the subsidiary area SBA in the second direction DR2 may be smaller than the length of the first area PNL_1 in the second direction DR2.

A driver circuit DC and a circuit board CB may be disposed on a surface of the subsidiary area SBA in the third direction DR3. The circuit board CB may be attached on the subsidiary area SBA using an anisotropic conductive film (ACF). The circuit board CB may be electrically connected to a pad area formed on the subsidiary area SBA. The circuit board CB may be a flexible printed circuit board (FPCB), a printed circuit board (PCB), or a flexible film such as a chip-on-film (COF). The driver circuit DC may be implemented as an integrated circuit (IC) and may be attached to the subsidiary area SBA by a chip-on-glass (COG) technique, a chip-on-plastic (COP) technique, or ultrasonic bonding. In other examples, the driver circuit DC may be mounted on the circuit board CB.

The display area DA of the display panel PNL may further include a third display area DA_3. The display area DA of the display panel PNL may be divided into the first display area DA_1, the second display area DA_2 and the third display area DA_3 depending on whether the display panel PNL slides on how long it slides. The presence of the second display area DA_2 and the third display area DA_3 may depend on whether the display panel PNL slides or not, and the areas of the second and third display areas DA_2 and DA_3 may vary depending on how long the display panel PNL slides. When the display panel PNL does not slide (hereinafter, referred to as a "basic display state"), it has the first display area DA_1 having a first area. When the display panel PNL slides, it further includes the expanded second display area DA_2 and the expanded third display area DA_3 in addition to the first display area DA_1.

In the second display area DA_2, the second area PNL_2 of the display panel PNL and the plane area PA may overlap each other. In the third display area DA_3, the third area PNL_3 of the display panel PNL and the plane area PA may overlap each other.

The areas of the second display area DA_2 and the third display area DA_3 may vary depending on how long the display device 1 slides. When the display device 1 slides to the maximum, the second display area DA_2 may have a second area, the third display area DA_3 may have a third area, and the display area DA may have a fourth area which is the sum of the first area, the second area, and the third area. The fourth area may be the maximum area of the display area DA.

The first display area DA_1 may overlap the first area PNL_1 of the display panel PNL. The second display area DA_2 may overlap at least a part of the second area PNL_2 of the display panel PNL, and the third display area DA_3 may overlap at least a part of the third area PNL_3 of the display panel PNL. The boundaries between the first display area DA_1 and the second display area DA_2 and between the first display area DA_1 and the third display area DA_3 may coincide with the boundaries between the first area PNL_1 and the second area PNL_2 and between the first area PNL_1 and the third area PNL_3, respectively. However, the disclosure is not limited thereto.

The support module SP of the sliding module SM may further include a third support member SP_3. The third support member SP_3 may be symmetrical to the second support member SP_2 with the first support member SP_1 disposed between the second support member SP_2 and the third support member SP_3. The third support member SP_3 may be disposed on a side of the first support member SP_1 in the first direction DR1, and the second support member SP_2 may be disposed on the opposite side of the first support member SP_1 in the first direction DR1.

The first support member SP_1, the second support member SP_2 and the third support member SP_3 may have substantially the same relative positional relationship with respect to the display panel PNL. When the display panel PNL is flat without bending, the first support member SP_1, the second support member SP_2 and the third support member SP_3 may be on substantially a same plane, and that plane may be parallel to the display panel PNL.

The third support member SP_3 and the second support member SP_2 may include the same material, and may both include joints 1000. The third support member SP_3 may have substantially the same structure as the second support member SP_2.

The panel storage SD may further include a front wall SD_5 at the end on a side in the first direction, and may not include a handle K (refer to FIGS. 1-3). The rear wall SD_1, the side walls SD_2 and the front wall SD_5 may not be integrally formed. When the display device 1 expands in the two directions, the rear wall SD_1 may move toward a side in the first direction DR1 while the front wall SD_5 may move toward the opposite side in the first direction DR1, such that the display device 1 may expand.

In doing so, although not shown in the drawings, the connection portion CP_2 on the opposite side of the panel driving module CP in the first direction DR1 may move toward the opposite side in the first direction DR1 along the rear wall SD_1 of the panel storage SD, the connection portion CP_2 on a side of the panel driving module CP in the first direction DR1 may move toward a side in the first direction DR1 along the front wall. The panel driving module CP may expand in both sides in the first direction DR1 as the display device 1 expands. Accordingly, the distance (or gap) between the rear sidewall SD_1 of the panel storage SD and the connection portion CP_2 of the panel driving module CP near the rear sidewall SD_1 may be maintained even when the display device 1 expands. Similarly, the gap between the front sidewall SD_5 and the connection portion CP_2 that faces the front sidewall SD_5 may also be maintained when the display device 1 is expanded.

The first support member SP_1 may include an air gap for absorbing an impact when an object such as a user's pen contacts the display panel PNL in the first area PNL_1. However, the disclosure is not limited thereto. When the first support member SP_1 includes an air gap as shown in FIG. 9, the width in the third direction DR3 (or thickness) of the first support member SP_1 disposed in the first area PNL_1 may be smaller than the width in the third direction DR3 (or thickness) of the joints 1000 of the second support member SP_2 and the third support member SP_3 disposed in the second area PNL_2 and the third area PNL_3. The thicknesses are not limited thereto when the first support member SP_1 does not include an air gap.

As described above, the display device may be either a single-slidable display device or a multi-slidable display device. Hereinafter, the arrangement of the joints 1000 will be described in more detail based on the arrangement of the first support member SP_1 and the second support member SP_2 that may vary according to the sliding movement of the display panel PNL.

Figure 10:
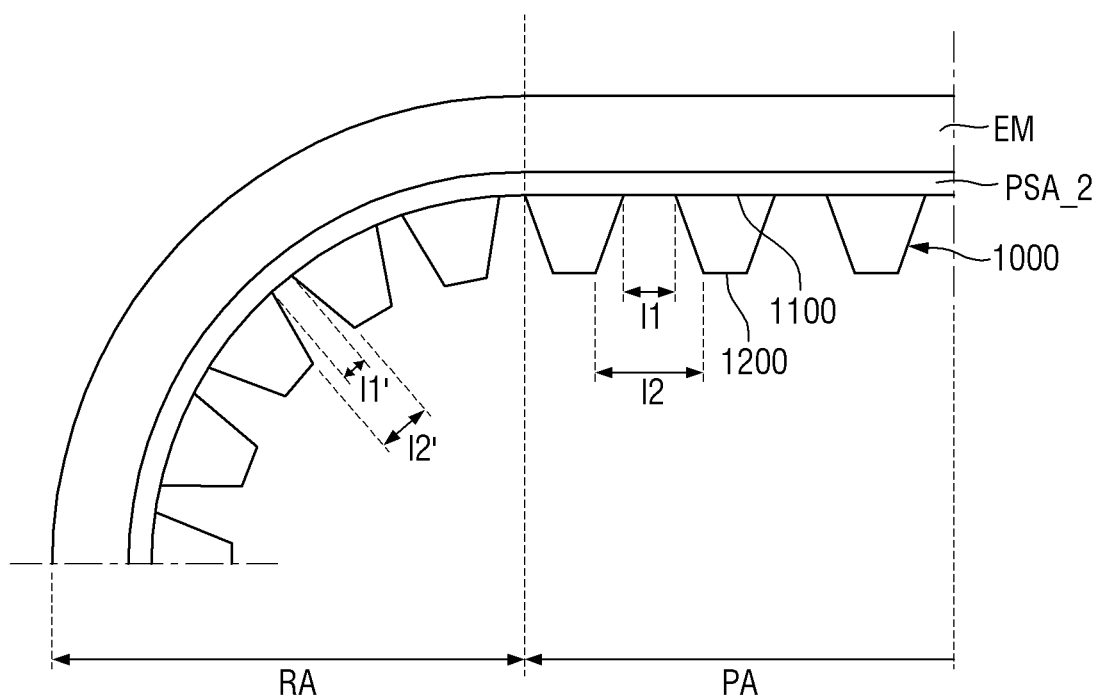
FIG. 10 is a schematic view showing free-end intervals and fixed-end intervals of joints of a second support member in a plane area and a round area of a display device according to Comparative Example.
Figure 11:
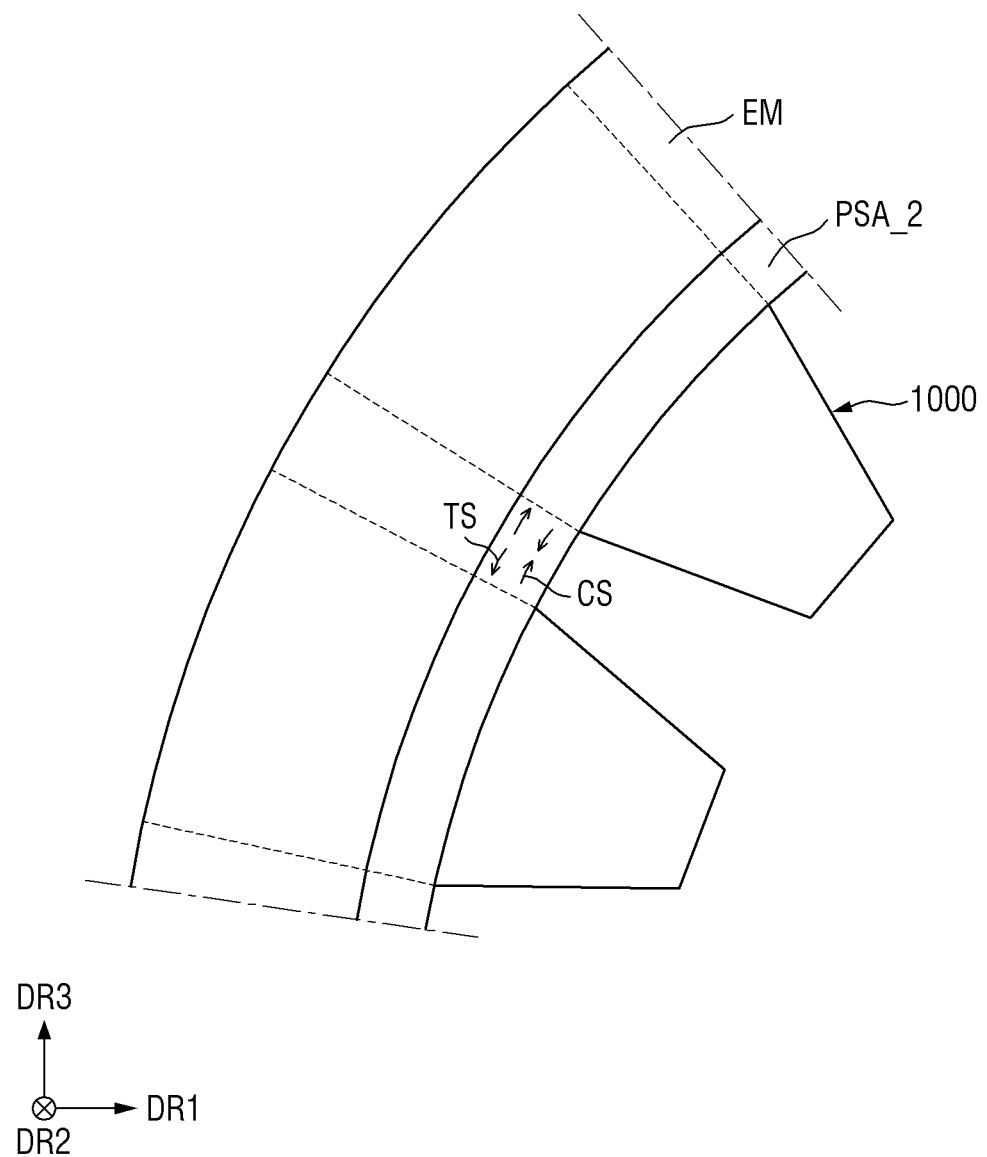
FIG. 11 is a schematic view showing a varying strain of a second adhesive member in the vicinity of a fixed-end interval of a second support member in the round area of the display device of FIG. 10.
Figure 12:
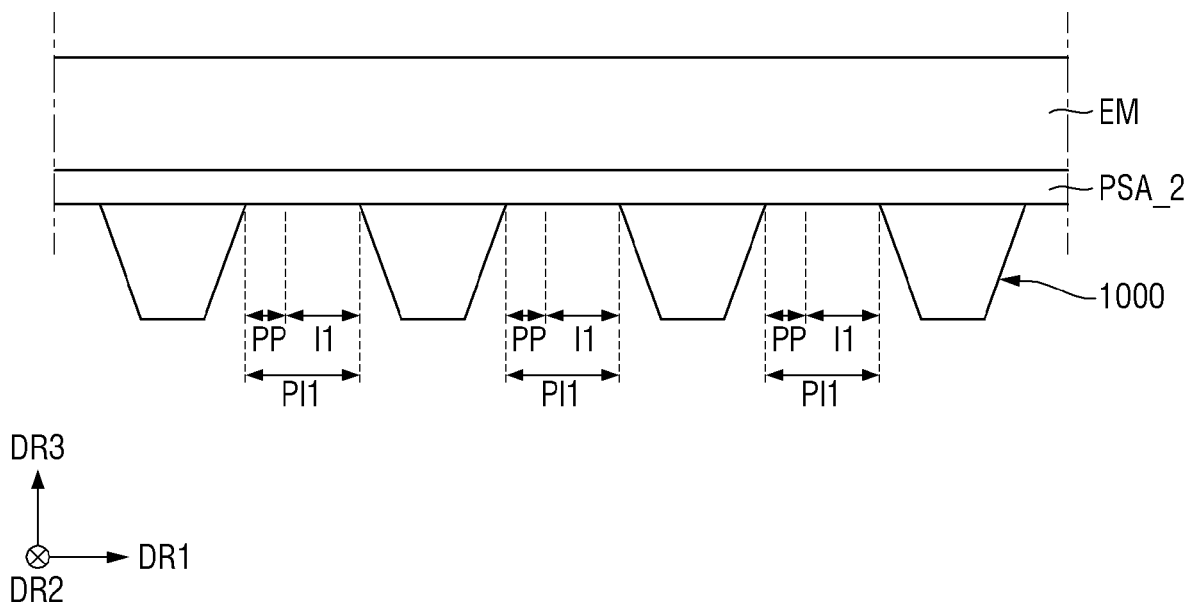
FIG. 12 is a schematic view showing regions where the adhesive member of the display device of FIG. 10 is elongated.
Figure 13:
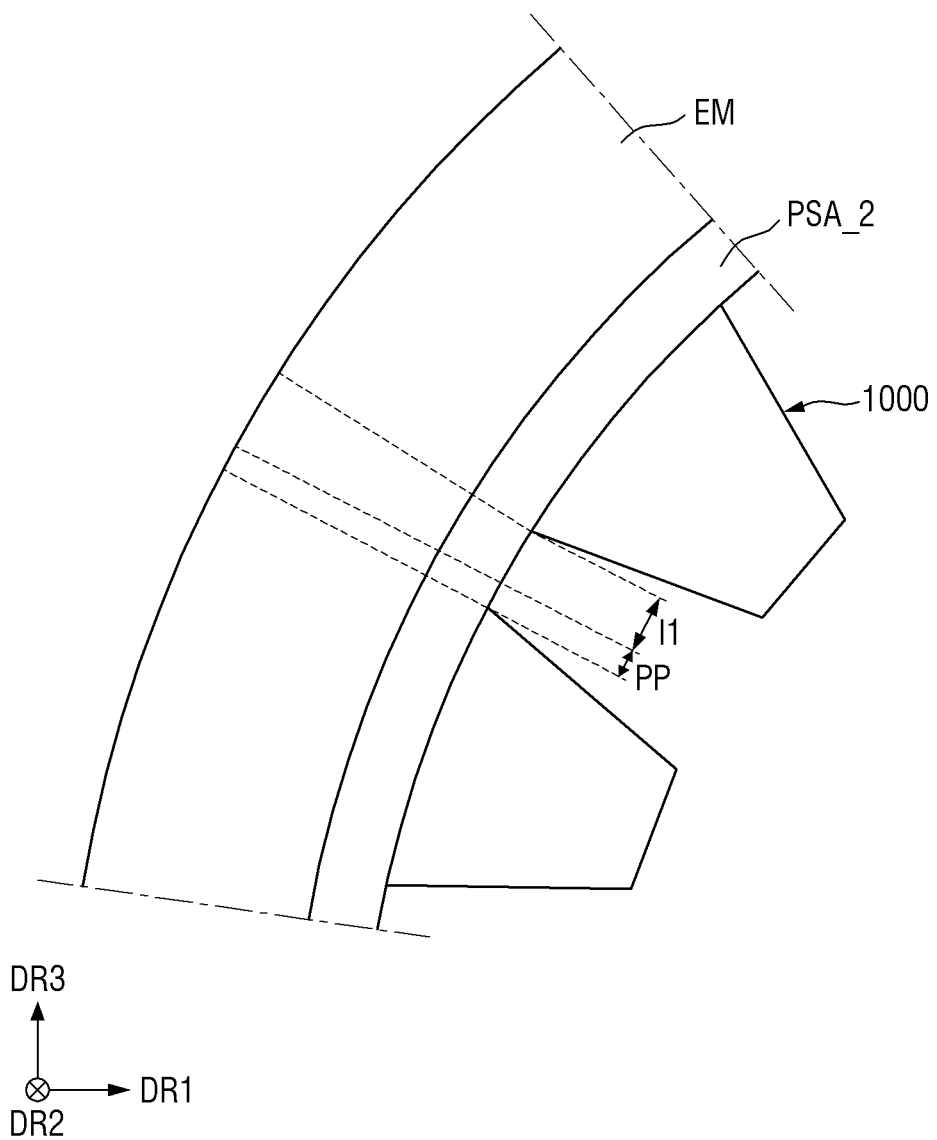
FIG. 13 is a schematic view showing a shifted joint due to the elongation of the adhesive member in the round area of the display device of FIG. 10.
Figure 14:
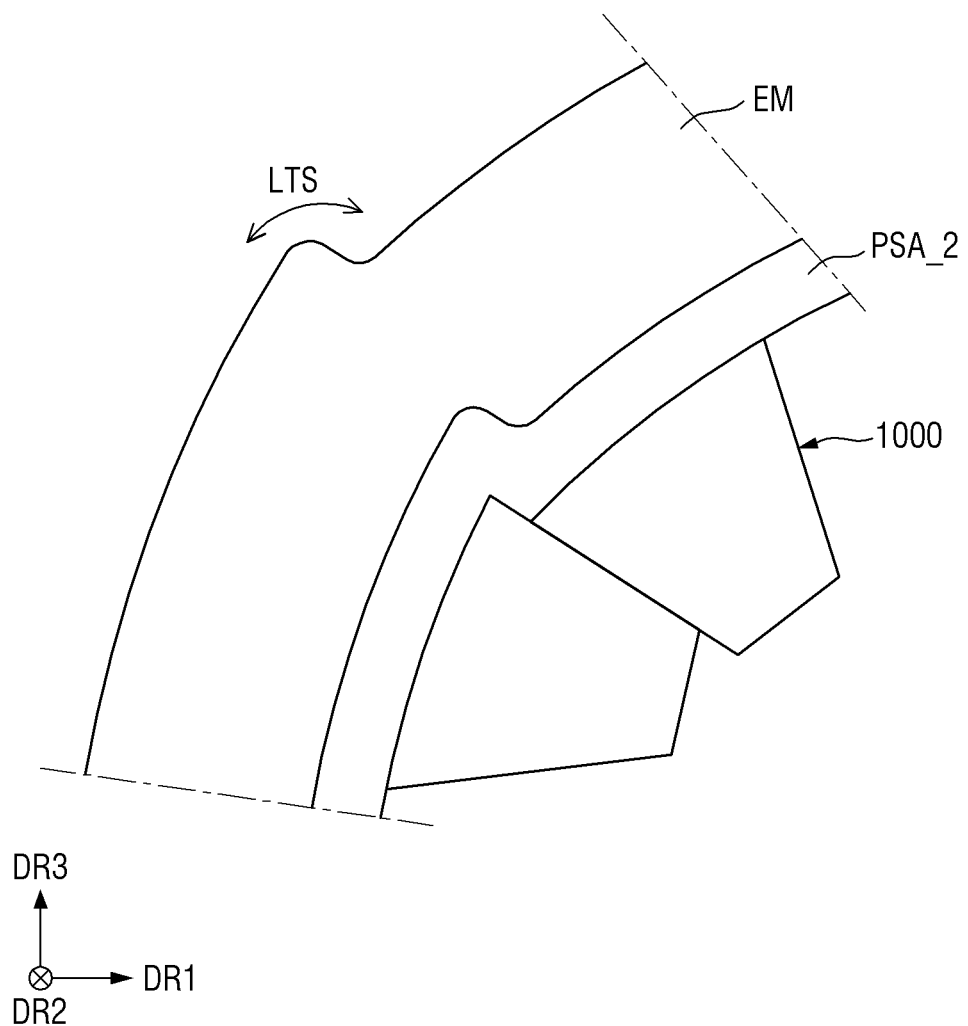
FIG. 14 is a schematic view showing tensile stress by local curvature applied to the display panel from interference between joints due to the shift of the joints in the display device of FIG. 10.

FIG. 10 is a schematic view showing free-end intervals and fixed-end intervals of joints of a second support member in a plane area and a round area of a display device according to a Comparative Example. FIG. 11 is a schematic view showing the varying strain of a second adhesive member in the vicinity of a fixed-end interval of a second support member in the round area of the display device of FIG. 10. FIG. 12 is a schematic view showing regions where the adhesive member of the display device of FIG. 10 is elongated. FIG. 13 is a schematic view showing a shifted joint due to the elongation of the adhesive member in the round area of the display device of FIG. 10. FIG. 14 is a schematic view showing tensile stress by local curvature applied to the display panel from interference between joints due to the shift of the joints in the display device of FIG. 10.

A display device according to a Comparative Example illustrated in FIGS. 10 to 14 is different from the display device 1 according to the embodiments in that spacers are not disposed in the space between the joints 1000.

The free-end interval I2 and the fixed-end interval I1 of the second support member SP_2 may vary depending on whether the second support member SP_2 is disposed is the round area RA or the plane area PA as shown in FIG. 10.

As shown in FIG. 10, in the plane area PA, the fixed-end interval I1 defined by the joints 1000 is less than the free-end interval I2. The fixed-end interval I1 and the free-end interval I2 formed in the plane area PA may be greater than the fixed-end interval I1' and the free-end interval I2' formed in the round area RA, respectively. A difference between the fixed-end interval I1 and the free-end interval I2 formed in the plane area PA may be greater than a difference between the fixed-end interval I1' and the free-end interval I2' formed in the round area RA. Accordingly, the distance between adjacent joints 1000 in the round area RA may be less than the distance between adjacent joints 1000 in the plane area PA.

Referring to FIG. 11, the second adhesive member PSA_2 is bent in the round area RA. A compressive stress (CS) compressing the second adhesive member PSA_2 may be applied to one surface of the second adhesive member PSA_2 which is closer to the joints 1000, while a tensile stress (TS) pulling the second adhesive member PSA_2 apart may be applied to the opposite surface of the second adhesive member PSA_2 which is farther from the joints 1000. As a result, strain is accumulated in the second adhesive member PSA_2. If the sliding operation of the display panel PNL is repeated, more strain may be accumulated in the second adhesive member PSA_2, causing fatigue. As a result, the second adhesive member PSA_2 may be deformed due to repeated fatigue, i.e., the second adhesive member PSA_2 may be elongated.

When the sliding operation of the display panel PNL is repeated, the second adhesive member PSA_2 may be deformed due to repeated fatigue, i.e., the second adhesive member PSA_2 may be elongated. The joints 1000 may be shifted in the first direction DR1 and elongated regions may be formed, as shown in FIG. 12. In such case, the shifted fixed-end interval PI1 may be defined as the sum of the fixed-end interval I1 before the second adhesive member PSA_2 is elongated and the elongated regions PP.

Referring to FIG. 13, when the distance between the fixed ends 1100 changes from the fixed-end interval I1 to the shifted fixed-end interval PI1 in the round area RA, it may be difficult to maintain an equal spacing between adjacent joints 1000. The strain on the second adhesive member PSA_2 may vary more greatly between the fixed ends 1100, and accordingly the adjacent joints 1000 may become closer to each other than the adjacent joints 1000 when the joints 1000 are not shifted.

When the strain on the second adhesive member PSA_2 varies largely due to the shifted fixed-end interval PI1 and thus the joints 1000 move in the round area RA, adjacent joints 1000 may contact each other as shown in FIG. 14. Interference between the joints 1000 may occur, i.e., the fixed end 1100 of the joint 1000 becomes staggered with the fixed end 1100 of the adjacent joint 1000. Accordingly, a local curvature different from the global curvature of the second adhesive member PSA_2 (a wrinkle in the surface of the second adhesive member PSA_2) may be formed in the round area RA. A local tensile stress (LTS) due to the local curvature (the wrinkle) may be additionally applied to the second adhesive member PSA_2, in addition to the tensile stress due to bending. Accordingly, a stress applied to the display panel PNL may increase, thereby causing a defect in the display panel PNL.

The elongation of the second adhesive member PSA_2 as described above may be prevented or reduced by the spacers 1300 disposed between the adjacent joints 1000. Hereinafter, the spacer 1300 will be described in detail.

Figure 15:
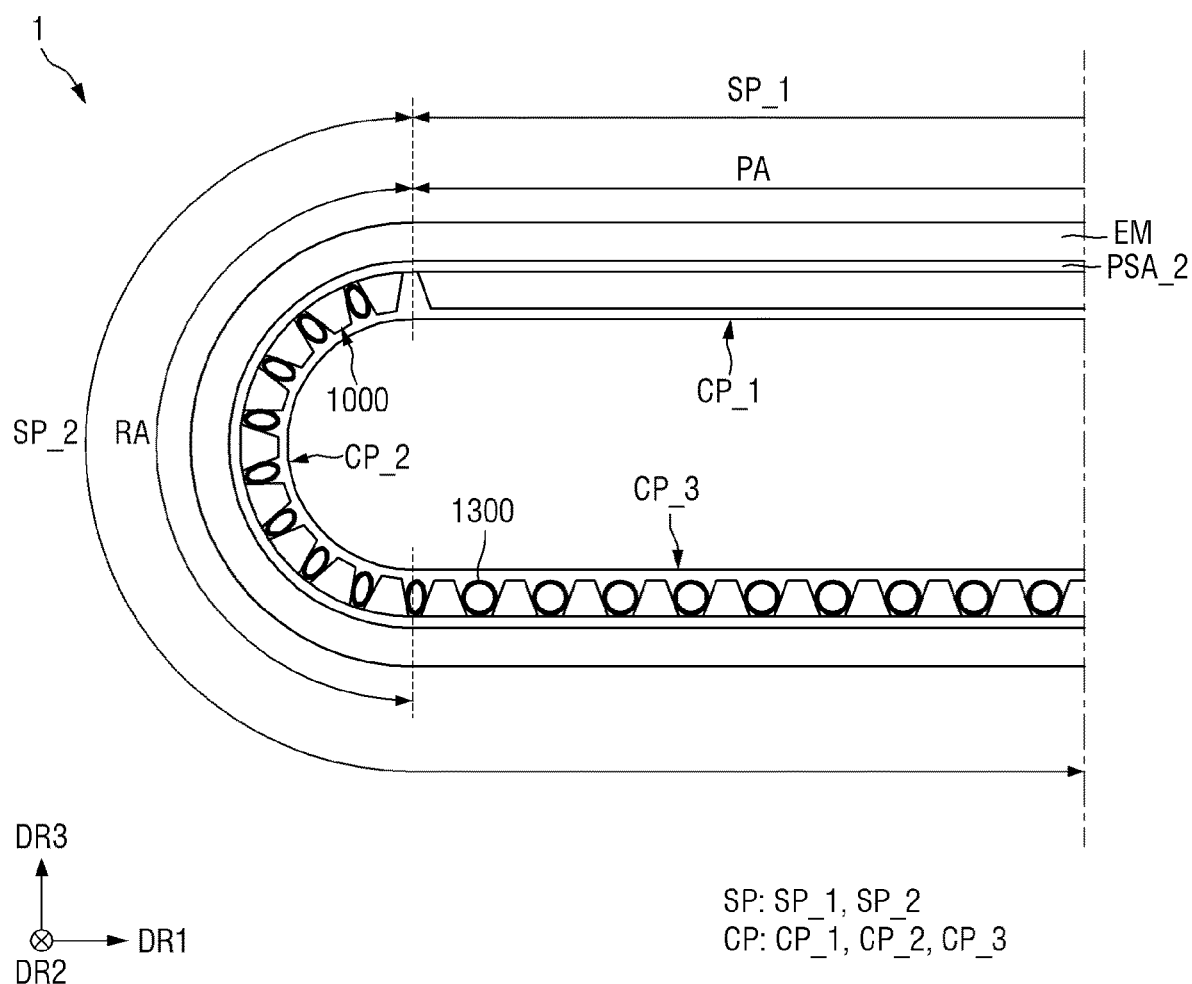
FIG. 15 is a schematic view showing an arrangement relationship between second and first support members and a panel driving module when the display device according to an embodiment is in a basic display state.
Figure 16:
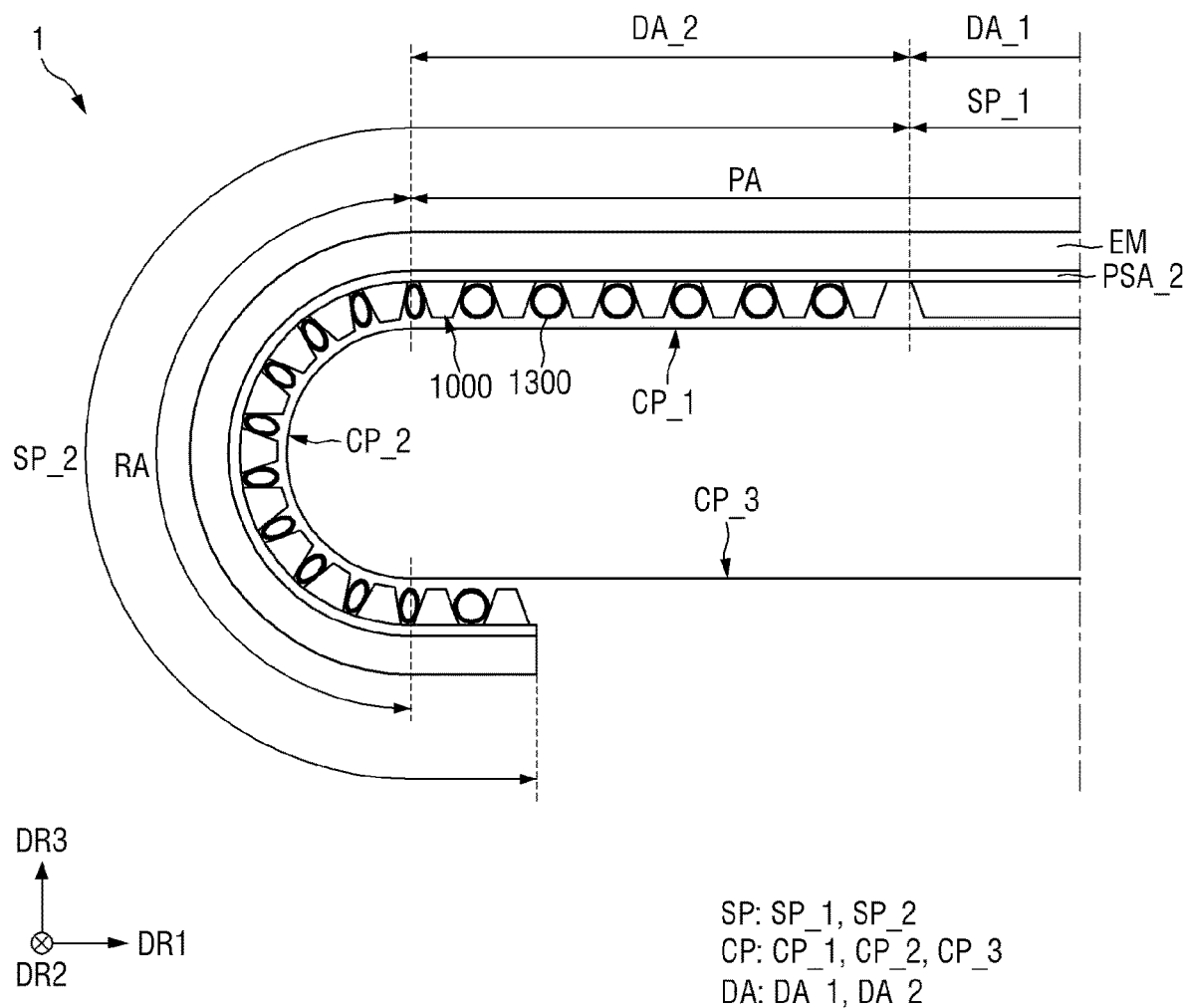
FIG. 16 is a schematic view showing an arrangement relationship between the second and first support members and the panel driving module when the display device according to the embodiment expands.
Figure 17:
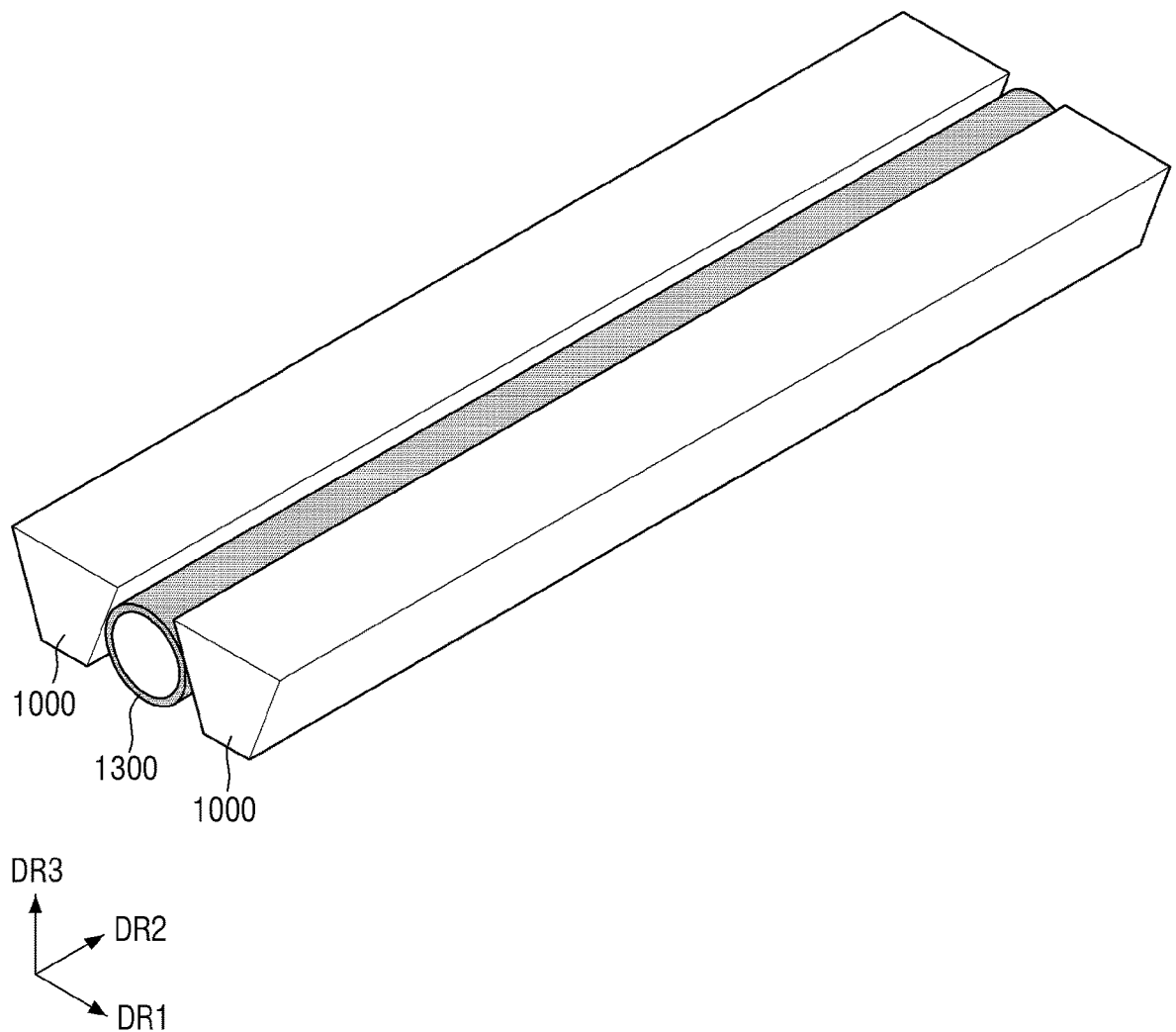
FIG. 17 is a schematic perspective view showing a spacer disposed between adjacent joints in the plane area of the display device according to an embodiment.
Figure 18:
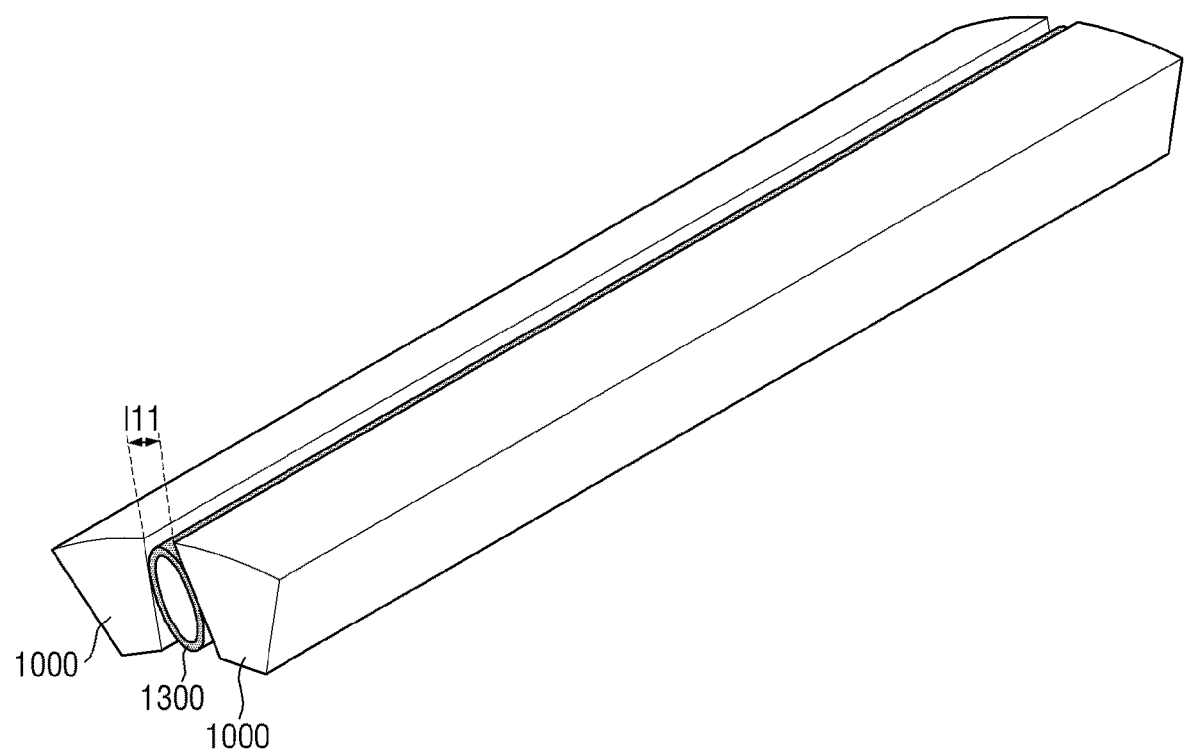
FIG. 18 is a schematic perspective view showing a hollow tube disposed between adjacent joints in the round area of the display device according to the embodiment of the disclosure.

FIG. 15 is a schematic view showing an arrangement relationship between second and first support members and a panel driving module when the display device according to an embodiment is in a basic display state. FIG. 16 is a schematic view showing an arrangement relationship between the second and first support members and the panel driving module when the display device according to the embodiment expands. FIG. 17 is a schematic perspective view showing a spacer disposed between adjacent joints in the plane area of the display device according to an embodiment. FIG. 18 is a schematic perspective view showing a hollow tube disposed between adjacent joints in the round area of the display device according to the embodiment of the disclosure.

Referring to FIGS. 15 to 18, in the display device 1 according to an embodiment, a plane area PA where a display panel PNL is flatly disposed on the front portion CP_1 of a panel driving module CP and images are displayed, and a round area RA where the display panel PNL is bent on a connection portion CP_2 of the panel driving module CP and stored in the panel storage SD. The first support member SP_1 and the second support member SP_2 may be divided by dashed lines shown in FIGS. 15 and 16.

As described above, the spacers 1300 are disposed in the spaces between the joints 1000 of the second support member SP_2. The spacers 1300 may maintain a constant distance between adjacent joints 1000. The spacers 1300 are elements having a restoring force. For example, as shown in FIG. 17, a spacer 1300 may be a cylindrical hollow tube having a circular cross section and extending in parallel with the joints 1000 in the second direction DR2. It should be noted that the shape of the spacer 1300 is not limited thereto. The length of the empty space in the center of the spacer 1300 in the second direction DR2 may be substantially equal to the length of the spacer 1300 in the second direction DR2, but the disclosure is not limited thereto. The spacer 1300 may have a selected elastic modulus.

The length of the spacer 1300 in the second direction DR2 may be equal to the length of the joints 1000 in the second direction DR2 as shown in FIG. 17. The spacer 1300 may be disposed between the joints 1000 such that it does not protrude in the second direction DR2.

When the display device 1 is in the basic display state, as shown in FIG. 15, the first support member SP_1 may be disposed in the plane area PA and a part of the second support member SP_2 may be disposed in the round area RA. The first area PNL_1 of the display panel PNL may be exposed to the outside through the open area SD_4 (refer to FIG. 3) in the plane area PA, and the second area PNL_2 of the display panel PNL may be disposed in the round area RA and stored in the panel storage SD. The overall curvature of the second adhesive member PSA_2 disposed in the round area RA may be similar to or equal to the curvature of the connection portion CP_2 of the panel driving module CP.

In case that the display panel PNL is bent in the round area RA, the distance between adjacent joints 1000 is reduced. The spacers 1300 interposed between the joints 1000 may receive pressure stress, such that it cannot maintain the original cylindrical shape and may be crushed as illustrated in FIG. 18. When the spacers 1300 have a sufficient elastic modulus, the cross section may maintain an ellipse. As the spacers 1300 maintain the ellipse, the minimum distance I11 may be maintained between the adjacent joints 1000. In this manner, it is possible to prevent or reduce the elongation of the second adhesive member PSA_2.

The elastic modulus of the spacers 1300 may be greater than about 2 MPa and less than about 3 GPa. When the elastic modulus of the spacers 1300 exceeds about 2 MPa, it may be possible to prevent the spacers 1300 from being completely crushed in the round area RA. When the elastic modulus of the spacers 1300 is less than about 3 GPa, the display panel PNL may be bent appropriately in the round area RA to facilitate the sliding operation, and it is also possible to prevent excessive stress from being transmitted to the display panel PNL due to the bending resistance. Examples of the material for the spacer 1300 may include, but is not limited to, at least one of a polymer such as polyurethane, synthetic rubber, and acrylic polymer.

The elastic modulus of the spacer 1300 may have a smaller value than the elastic modulus of the elastic member EM (refer to FIG. 5). When the elastic modulus of the spacers 1300 is smaller than the elastic modulus of the elastic member EM, the restoring force of the spacers 1300 does not change the strain on the elastic member EM, and thus it is possible to prevent the display panel PNL from being defective due to a change in the strain on the elastic member EM.

When the display device 1 expands, i.e., in the sliding state, the first support member SP_1 and the second support member SP_2 may move toward one side in the first direction DR1 as shown in FIG. 16, and accordingly at least a part of the second support member SP_2 may be disposed on the plane area PA. The first area PNL_1 of the display panel PNL disposed on the first support member SP_1 and a part of the second area PNL_2 of the display panel PNL disposed on the second support member SP_2 may be disposed in the plane area PA, to display images to the outside through the open area SD_4 (refer to FIG. 3). The other part of the second area PNL_2 of the display panel PNL may be disposed in the round area RA and stored in the panel storage SD. The overall curvature of the second adhesive member PSA_2 disposed in the round area RA may be similar to or equal to the curvature of the connection portion CP_2 of the panel driving module CP.

The cross section of the spacer 1300 disposed in the round area RA has an elliptical shape rather than its original circular shape as the display panel PNL is bent and accordingly the distance between the adjacent joints 1000 may be reduced, as shown in FIG. 18. The spacer 1300 moved to the plane area PA by the sliding operation may recover its original cylindrical shape by its own restoring force, as shown in FIG. 17.

In this manner, the spacer 1300 may maintain the uniform distance between the adjacent joints 1000, and the flatness of the second display area DA_2 may be maintained more easily when the display panel PNL of the display device 1 is expanded.

In some embodiments, the spacers 1300 may not be attached to the joints 1000. The spacers 1300 are not necessarily attached to the joints 1000 by a bonding member such as an adhesive. For example, the spacers 1300 may have a diameter larger than the distance between the joints 1000 in the plane area PA, and may be inserted between the joints 1000. Because the spaces 1300 have its own restoring force, they are not deviated from the space between the joints 1000. When the spacers 1300 are inserted between the joints 1000 without any bonding member, it is possible to prevent the spacers 1300 from being torn by the bonding member. The movement of the joints 1000 is not restricted by the bonding member, so that stress applied to the display panel PNL may be reduced.

As described above, in the display device 1 according to an embodiment, it is possible to maintain the minimum spacing between the adjacent joints 1000 (the minimum distance I11 in FIG. 18) of the second support member SP_2 without interfering with the bending of the display panel PNL in the round area RA. As a result, it is possible to prevent the elongation of the adhesive member, and thereby preventing the tensile stress due to the local curvature caused by the interference between the joints 1000. Accordingly, it is possible to prevent defects on the display panel PNL.

Hereinafter, other embodiments of the disclosure will be described. In the following description, the same or similar elements will be denoted by the same or similar reference numerals, and redundant descriptions will be omitted or briefly described.

Figure 19:
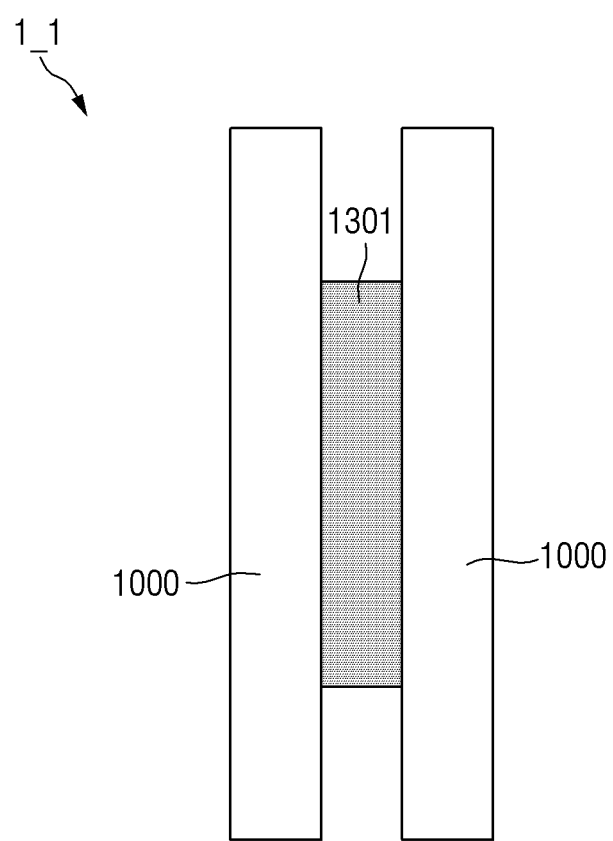
FIG. 19 is a schematic plan view showing a hollow tube disposed between adjacent joints according to an embodiment of the disclosure in the third direction DR3.
Figure 19:
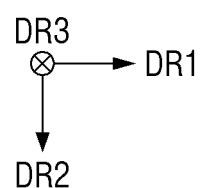

FIG. 19 is a plan view showing a hollow tube disposed between adjacent joints according to an embodiment of the disclosure in the third direction DR3.

A display device 1_1 according to the embodiment of FIG. 19 is different from the display device 1 of FIG. 1 in that the length of a spacer 1301 in the second direction DR2 is smaller than the length of joints 1000 in the second direction DR2.

As shown in FIG. 19, the length of the spacer 1301 does not necessarily have to be equal to the length of the joints 1000. Even if the spacer 1301 is shorter than the joints 1000, it may be possible to maintain the distance between the joints 1000 to prevent the elongation of the second adhesive member PSA_2. However, if the length of the spacer 1301 is too short, the area of the joints 1000 on which the restoring force of the spacer 1301 acts may be reduced. Therefore, the restoring force may be insufficient to maintain the spacing between the adjacent joints 1000. The length of the spacer 1301 may be equal to or greater than half the length of the joints 1000 in the second direction DR2.

In case that the spacer 1301 is not located in the middle portion in the second direction DR2 but is located closer to one of the ends in the second direction DR2, the pushing force may not be equally applied between the adjacent joints 1000, and thus a strain on the second adhesive member PSA_2 may vary. For this reason, the spacer 1301 may be located in the middle portion of the adjacent joints 1000 in the second direction DR2, as shown in FIG. 19.

Although only one spacer 1301 is disposed between the adjacent joints 1000 in the example shown in FIG. 19, the number of the spacers 1301 disposed between each of the adjacent joints 1000 is not limited thereto. For example, two or more spacers 1301 may be disposed between adjacent joints 1000. The sum of the lengths in the second direction DR2 of the spacers 1301 that are disposed between adjacent joints 1000 may be equal to or greater than half the length of the joints 1000.

As in this embodiment, when the length of the spacers 1301 in the second direction DR2 is equal to or greater than half of the length of the joints 1000 in the second direction DR2, it is possible to prevent the elongation of the second adhesive member PSA_2 while reducing the cost required for fabricating the spacers 1301.

Figure 20:
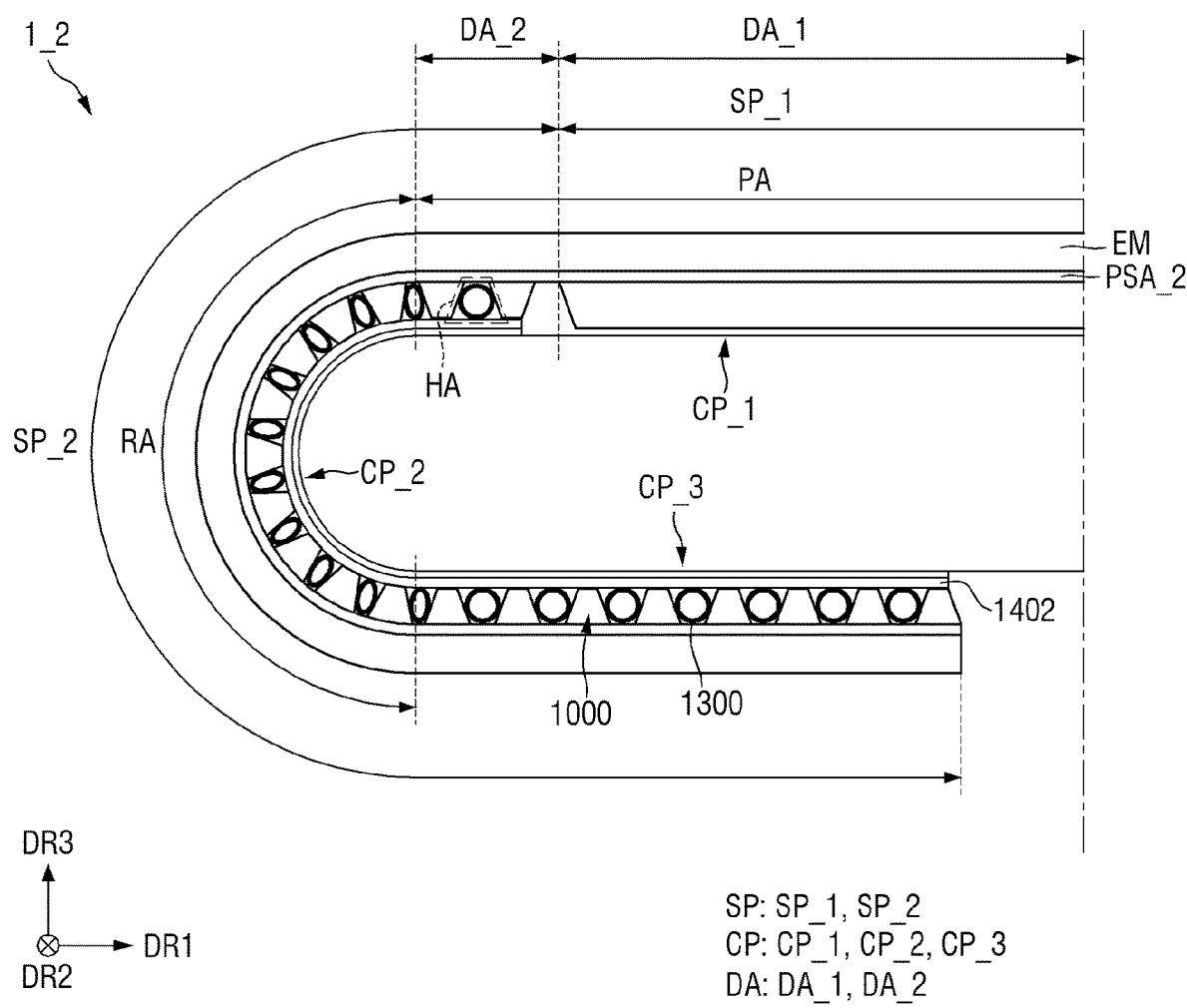
FIG. 20 is a schematic view of a display device according to an embodiment of the disclosure.
Figure 21:
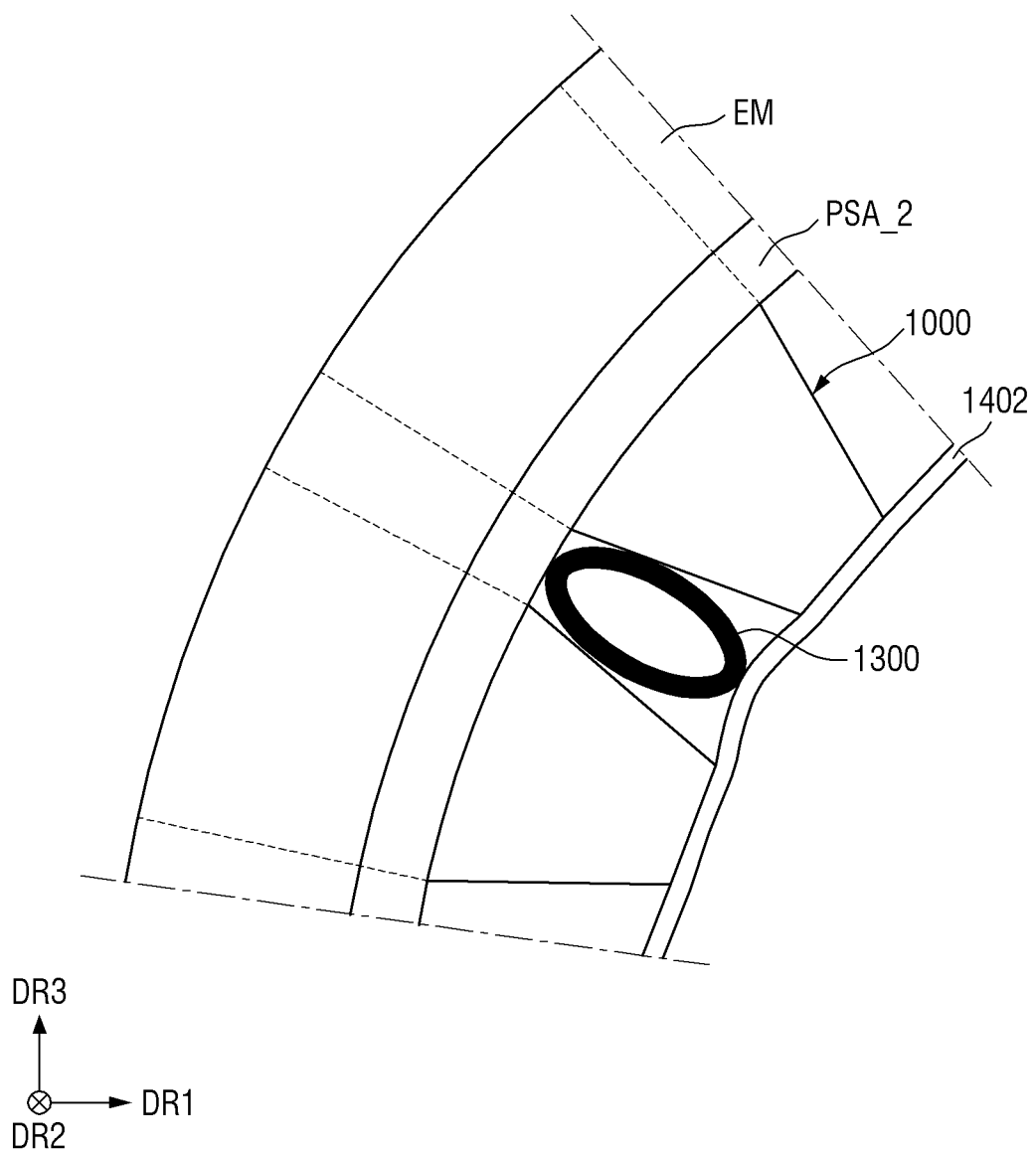
FIG. 21 is an enlarged schematic view of a rounded area of the display device according to the embodiment of FIG. 20.

FIG. 20 is a schematic view of a display device according to an embodiment of the disclosure. FIG. 21 is an enlarged schematic view of a round area of the display device according to the embodiment of FIG. 20.

A display device 1_2 according to the embodiment of FIG. 20 is different from the display device according to the embodiment of FIG. 1 in that the display device 1_2 includes a spacer sealing member 1402.

The spacer sealing member 1402 may prevent the spacers 1300 from deviating from the space between the adjacent joints 1000. The spacer sealing member 1402 may be disposed between the second support member SP_2 and the display driving module CP. The spacer sealing member 1402 may be attached to the free end of each of the joints 1000 with an adhesive member such as a thermosetting adhesive and PSA, and may be spaced apart from the display driving module CP by a selected distance. The spacer sealing member 1402 may not be attached to the opposite surface of the first support member SP_1 in the first direction DR1. Since the spacer sealing member 1402 is not attached to the opposite surface of the first support member SP_1 in the first direction DR1, stress acting on the spacer sealing member 1402 may be reduced.

The spacer sealing member 1402 may have a selected thickness in the third direction DR3. Accordingly, as shown in FIG. 20, the first support member SP_1 may have a thickness in the third direction DR3 which is larger than the joints 1000 of the second support member SP_2 by a selected thickness of the space sealing member 1402 in the third direction DR3, but the disclosure is not limited thereto.

The spacer sealing member 1402 may extend from one end to the other end of the second support member SP_2 along the elastic member EM. The spacer sealing member 1402 may have substantially the same shape as the part of the elastic member EM overlapping the second support member SP_2 and the same shape as the second area PNL_2 of the display panel PNL in a plan view. However, the disclosure is not limited thereto. The spacer sealing member 1402 may be bent together with the display panel PNL and the elastic member EM in the round area RA, and may be flat together with the display panel PNL and the elastic member EM in the plane area PA. The spacer sealing member 1402 may contact the free ends 1200 of the joints 1000, and thus a housing HA may be formed. The housing HA may be defined as the space surrounded by the spacer sealing member 1402 and the adjacent joints 1000. The spacer 1300 may be disposed in the housing HA.

In case that the spacer sealing member 1402 is bent in the round area RA, its area is expanded, while the distance between the adjacent joints 1000 disposed in the round area RA is reduced. Accordingly, a wrinkle may be generated on the spacer sealing member 1402 in the free-end interval I2 of the joints 1000 in the round area. The wrinkle generated in the spacer sealing member 1402 may protrude toward the spacer 1300 or protrude toward the display driving module CP. When the wrinkle of the spacer sealing member 1402 protrudes toward the spacer 1300 as shown in FIG. 21, it may help in preventing the spacer 1300 disposed in the housing HA from deviating from the space between the adjacent joints 1000.

The elastic modulus of the spacer sealing member 1402 may be less than about 2 GPa. When the elastic modulus of the spacer sealing member 1402 is less than about 2 GPa, a force of an appropriate magnitude is required to bend the spacer sealing member 1402, and thus it is possible to prevent the occurrence of tensile stress applied to the display panel PNL from the force for bending the spacer sealing member 1402. In order to absorb as much as possible the stress generated as the spacer sealing member 1402 is bent in the round area RA together with the display panel PNL, the elastic modulus of the spacer sealing member 1402 may be smaller than the elastic modulus of the elastic member EM and the elastic modulus of the spacer 1300.

Figure 22:
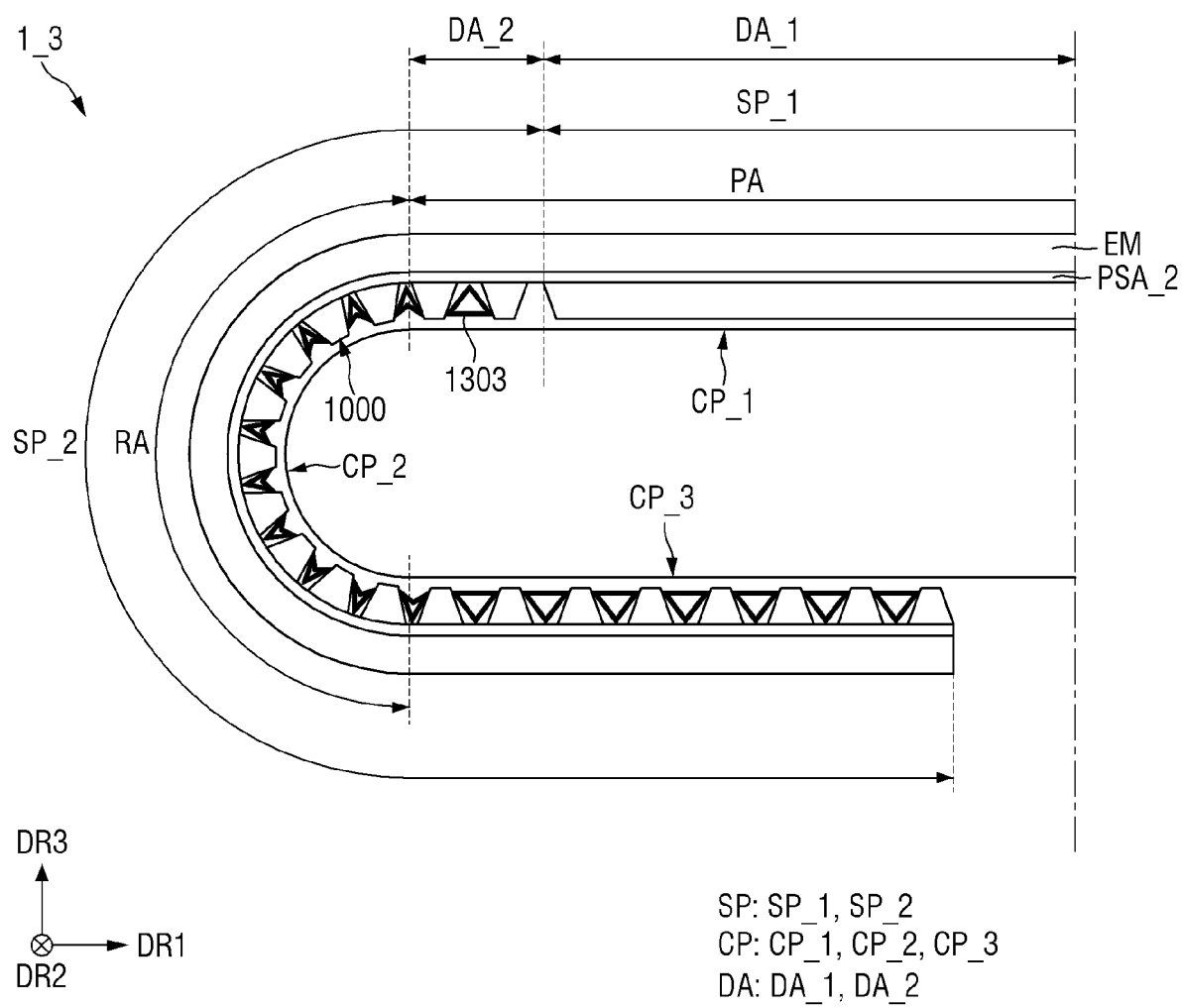
FIG. 22 is a schematic view of a display device according to an embodiment of the disclosure.

FIG. 22 is a schematic view of a display device according to an embodiment of the disclosure.

A display device 1_3 according to the embodiment of FIG. 22 is different from the display device according to the embodiment of FIG. 1 in that a spacer 1303 is implemented as a hollow tube having an equilateral triangular cross section.

As shown in FIG. 22, the spacers 1303 according to this embodiment may be arranged such that one vertex of an equilateral triangle faces the fixed-end interval I1 (refer to FIG. 5), and the base of the equilateral triangle opposite to the vertex may be parallel to the fixed-end interval I1.

In the round area RA, as the distance between the joints 1000 of the second support member SP_2 becomes narrower, the cross section of the spacers 1303 may be crushed such that the center of the base of the equilateral triangle is bent toward the vertex of the equilateral triangle. The minimum spacing between the adjacent joints 1000 in the round area RA may be maintained by the elastic modulus of the crushed spacers 1303.

In the display device 1_3 according to this embodiment, as described above with reference to FIG. 19, the length of the spacers 1303 in the second direction DR2 may be equal to or greater than half the length of the joints 1000 in the second direction DR2. The display device 1_3 may further include the spacer sealing member 1402 described above with reference to FIG. 20.

Figure 23:
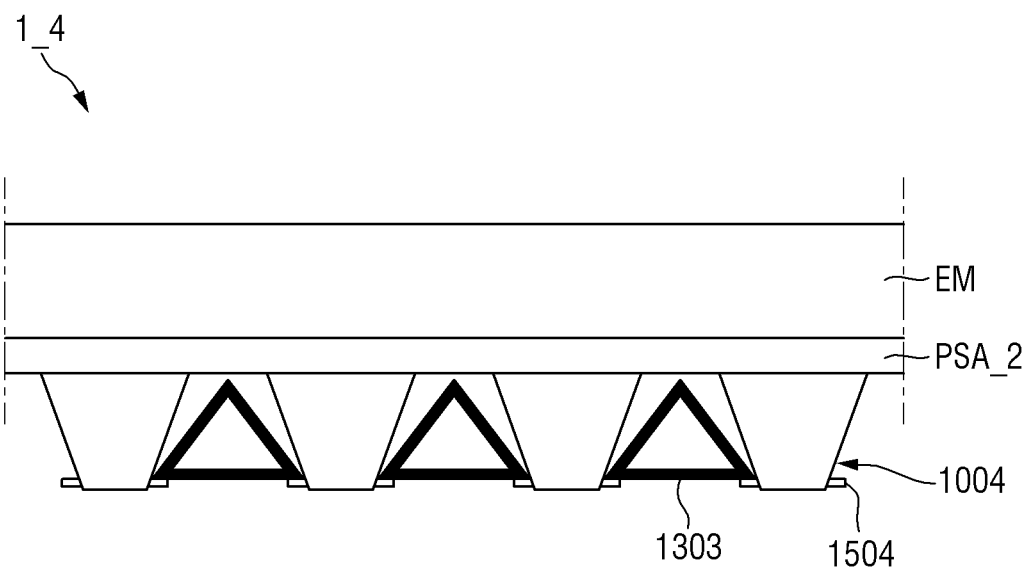
FIG. 23 is a schematic view showing joints and spacers of a display device according to an embodiment of the disclosure.

FIG. 23 is a schematic view showing joints and spacers of a display device according to an embodiment of the disclosure.

A display device 1_4 according to the embodiment of FIG. 23 is different from the display device 1_3 according to the embodiment of FIG. 22 in that joints 1004 further includes protrusions 1504.

As shown in FIG. 23, the joints 1004 of the display device 1_4 according to this embodiment may further include protrusions 1504 that protrude toward both sides in the first direction DR1 on two inclined surfaces LD and RD of the joints 1004.

The protrusions 1504 may prevent the spacers 1303 from deviating from the space between the adjacent joints 1000. The protrusions 1504 may be disposed at a location away from the fixed ends 1100 in the third direction DR3 on the inclined surfaces LD and RD of the joints 1004. The protrusions 1504 of each of the joints 1004 may have the same relative positional relationship. When the display panel PNL is flat without bending, the protrusions 1504 may be on substantially a same plane, and that plane may be parallel to the display panel PNL. The protrusions 1504 may be formed adjacent to the free ends 1200, but the disclosure is not limited thereto.

The protrusions 1504 may be attached to both of the inclined surfaces LD and RD of the joints 1004 as shown in FIG. 23, but the disclosure is not limited thereto. For example, the protrusions 1504 and the joints 1004 may be formed integral to each other.

The protrusions 1504 may flatly support the base of the spacers 1303. In this manner, it is possible to prevent the spacers 1303 from deviating from the space between the adjacent joints 1004.

Figure 24:
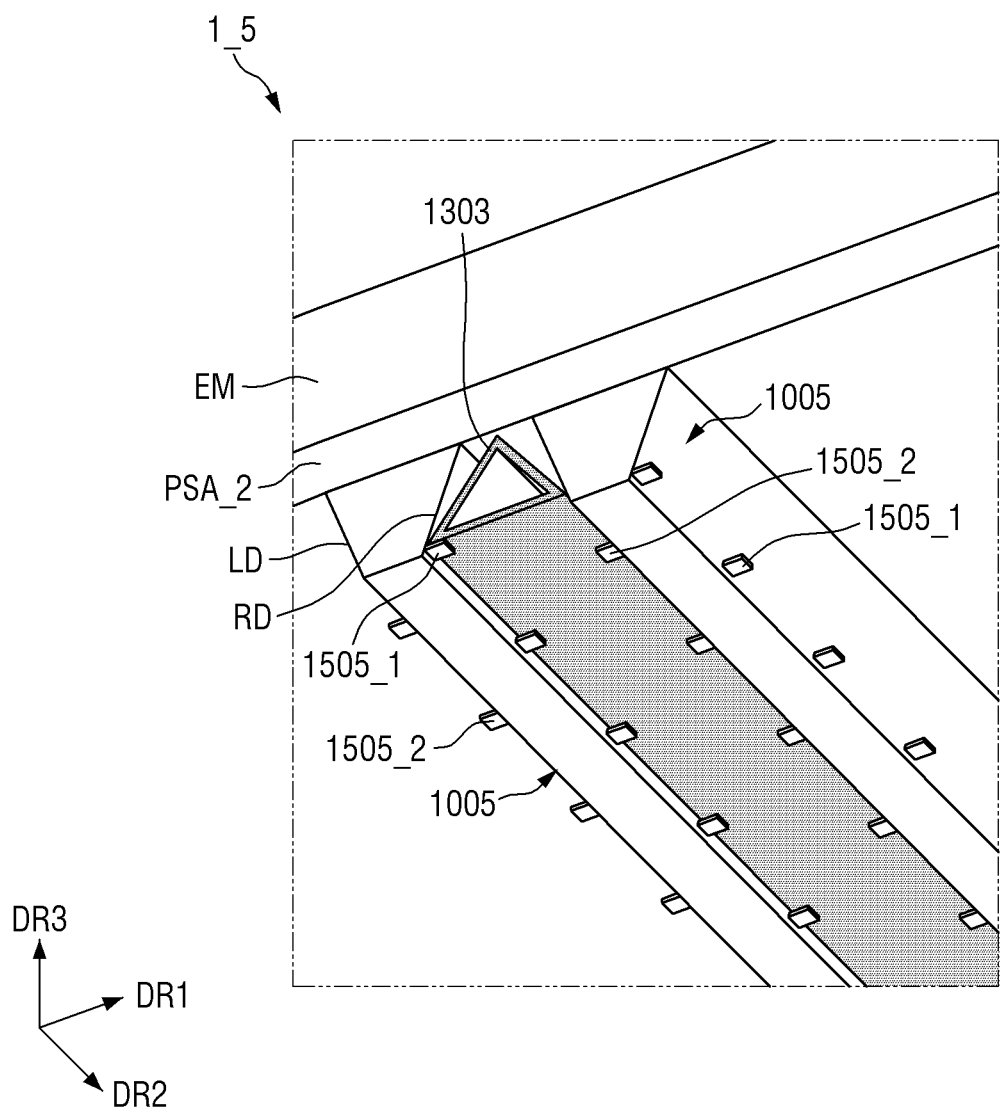
FIG. 24 is a schematic perspective view showing a spacer disposed between adjacent joints in a display device according to an embodiment of the disclosure.
Figure 25:
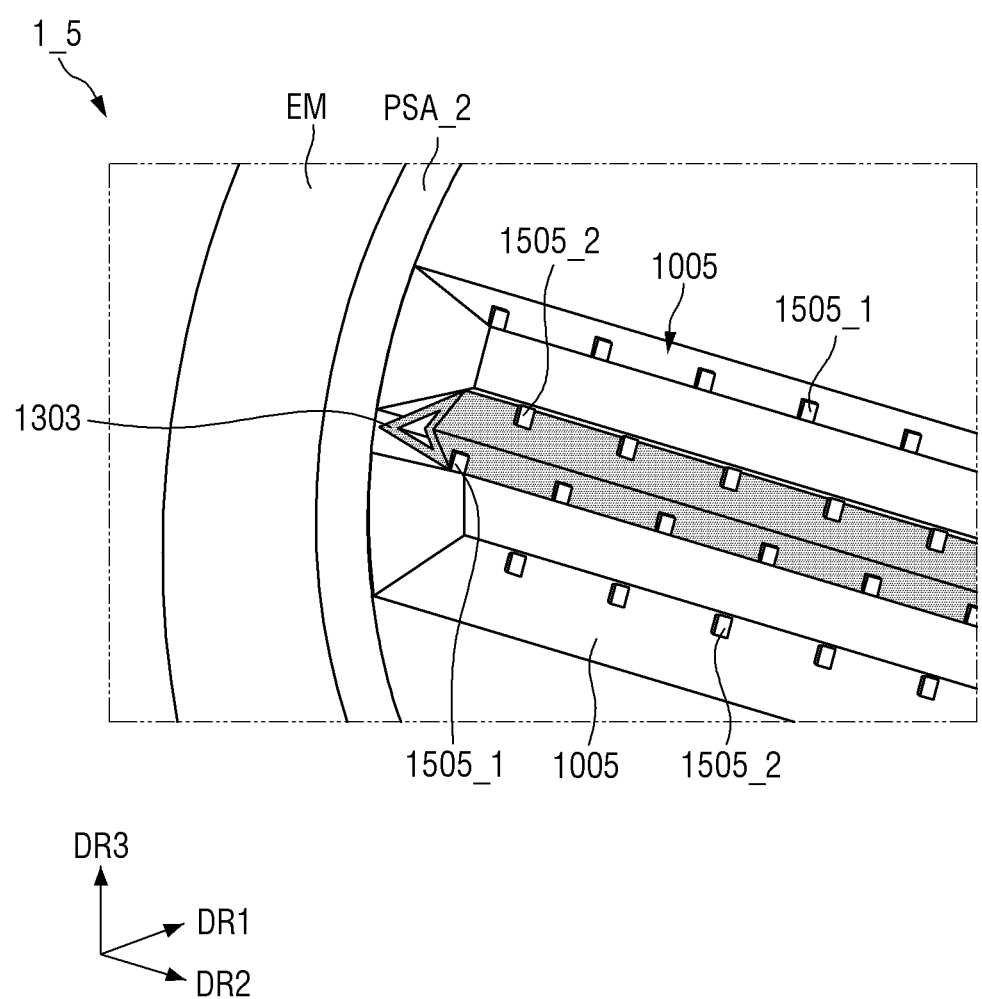
FIG. 25 is a schematic perspective view showing a crushed spacer when the display panel according to the embodiment of FIG. 24 is bent in the round area.

FIG. 24 is a perspective view showing a spacer disposed between adjacent joints in a display device according to an embodiment of the disclosure. FIG. 25 is a perspective view showing a crushed spacer in case that the display panel according to the embodiment of FIG. 24 is bent in the round area.

A display device 1_5 according to the embodiment of FIGS. 24 and 25 is different from the display device 1_4 according to the embodiment of FIG. 22 in that first protrusions 1505_1 protrude from the right inclined surface RD of each joint 1005, and second protrusions 1505_2 protrude from the left inclined surface LD of each joint 1005.

As shown in FIG. 24, the first protrusions 1505_1 may be spaced apart from each other at regular intervals on the right inclined surface RD of each joint 1005 to protrude therefrom and may be arranged side by side in the second direction DR2. The second protrusions 1505_2 may be spaced apart from each other at regular intervals on the left inclined surface LD of each joint 1005 to protrude therefrom and may be arranged side by side in the second direction DR2.

The protruding positions of the first protrusions 1505_1 and the second protrusions 1505_2 do not overlap each other in the first direction DR1. The second protrusions 1505_2 may be disposed on the left inclined surface LD at positions corresponding to the intervals between the first protrusions 1505_1 disposed on the right inclined surface RD of each of the joints 1005. Accordingly, when the joints 1005 of the display device 1_5 according to this embodiment are viewed in the third direction DR3, as shown in FIG. 24, the first protrusions 1505_1 and the second protrusions 1505_2 protruding from each of the joints 1005 may be staggered.

In this manner, in the display device 1_5 according to this embodiment, when the display panel PNL is disposed on the round area RA and the distance between the adjacent joints 1005 becomes narrow, the first protrusions 1505_1 protruding from the right inclined surface RD of the joint 1005 and the second protrusions 1505_2 protruding from the left inclined surface LD of the joint 1005 become closer to each other, as shown in FIG. 25. The staggered first protrusions 1505_1 and the second protrusions 1505_2 may repeatedly overlap each other when viewed in the second direction DR2. Accordingly, the length of the first protrusion 1505_1 and the second protrusion 1505_2 supporting the spacer 1303 may become longer, so that the spacer 1303 may be supported more stably.

Figure 26:
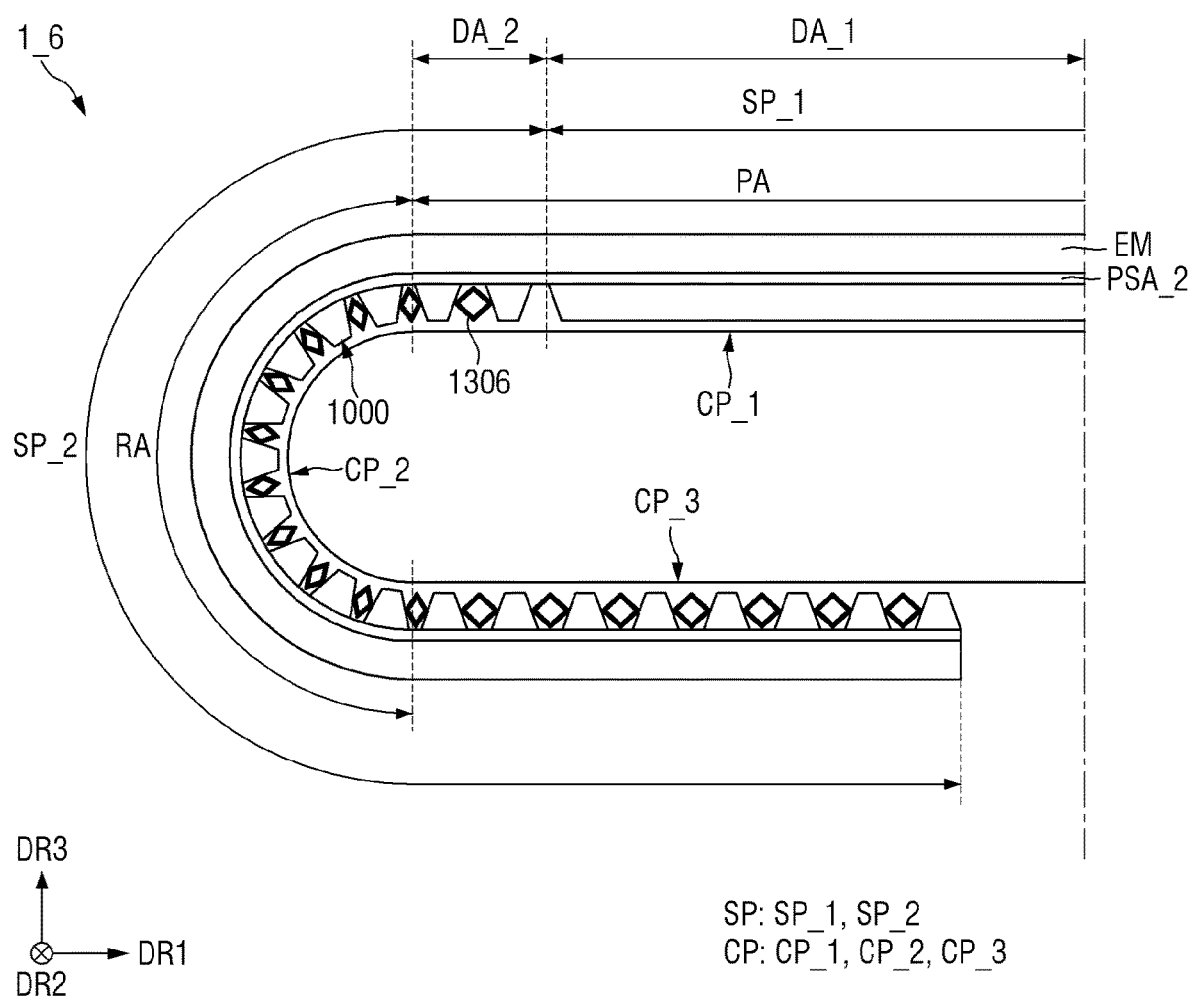
FIG. 26 is a schematic view showing spacers disposed between adjacent joints in a display device according to an embodiment of the disclosure.

FIG. 26 is a plan view showing spacers disposed between adjacent joints in a display device according to an embodiment of the disclosure.

A display device 1_6 according to the embodiment of FIG. 26 is different from the display device 1 according to the embodiment of FIG. 1 in that a spacer 1306 is implemented as a hollow tube having a diamond cross section.

As shown in FIG. 26, the spacers 1306 according to this embodiment may be arranged such that one vertex of a diamond faces the fixed-end interval I1 while the opposite vertex of the diamond faces the panel driving module CP in the plane area PA.

In the round area RA, as the distance between the joints 1000 of the second support member SP_2 becomes narrower, the spacers 1306 may be crushed. The minimum spacing between the adjacent joints 1000 in the round area RA may be maintained by the elastic modulus of the crushed spacers 1306.

In the display device 1_6 according to this embodiment, as described above with reference to FIG. 19, the length of the spacers 1306 in the second direction DR2 may be equal to or greater than half the length of the joints 1000 in the second direction DR2. The display device 1_3 may further include the spacer sealing member 1402 described above with reference to FIG. 20.

Figure 27:
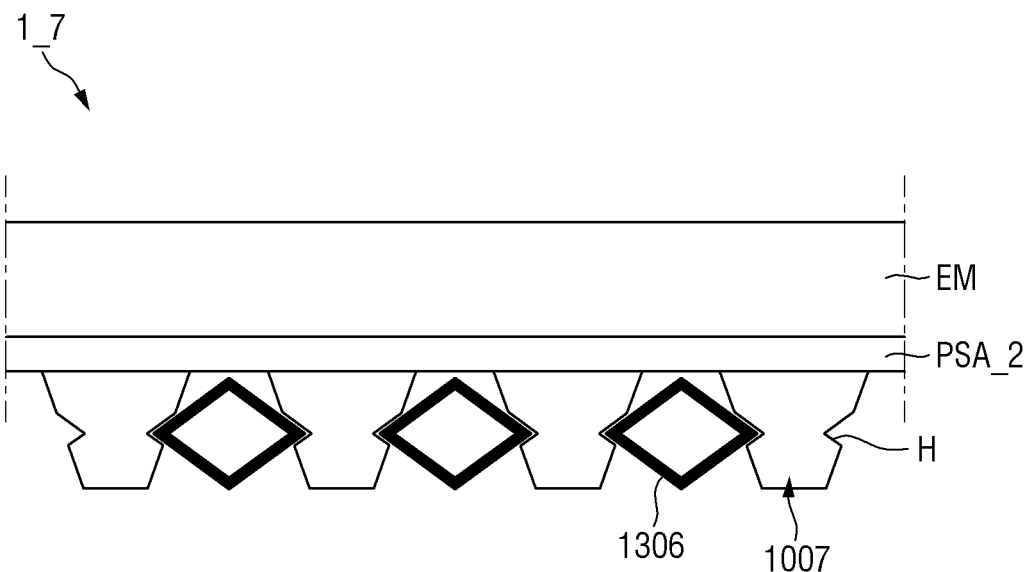
FIG. 27 is a schematic view showing spacers disposed between adjacent joints in a display device according to an embodiment of the disclosure.

FIG. 27 is a schematic view showing spacers disposed between adjacent joints in a display device according to an embodiment of the disclosure.

A display device 1_7 according to the embodiment of FIG. 27 is different from the display device 1_6 according to the embodiment of FIG. 26 in that joints 1007 further includes grooves H in two inclined surfaces.

The joints 1007 may further include grooves H that are depressed into the inclined surfaces LD and RD toward the inside of the joints 1007 and are extended in the second direction DR2.

The grooves H may prevent the spacers 1306 from deviating from the space between the adjacent joints 1007. The length of the grooves H in the second direction DR2 may be equal to the length of the joints 1007 in the second direction. The grooves H may be formed at a location away from the fixed ends in the third direction DR3 on the inclined surfaces LD and RD of the joints 1007. The grooves H of each of the joints 1007 may have the same relative positional relationship. When the display panel PNL is flat without bending, the grooves H may be on substantially a same plane, and that plane may be parallel to the display panel PNL. The grooves H may be formed in the middle between the fixed end 1100 and the free end 1200, but the disclosure is not limited thereto. The grooves H may be engaged with both vertices of the spacer 1306 in the first direction DR1. In this manner, it is possible to prevent the spacers 1306 from deviating from the space between the adjacent joints 1007.

Figure 28:
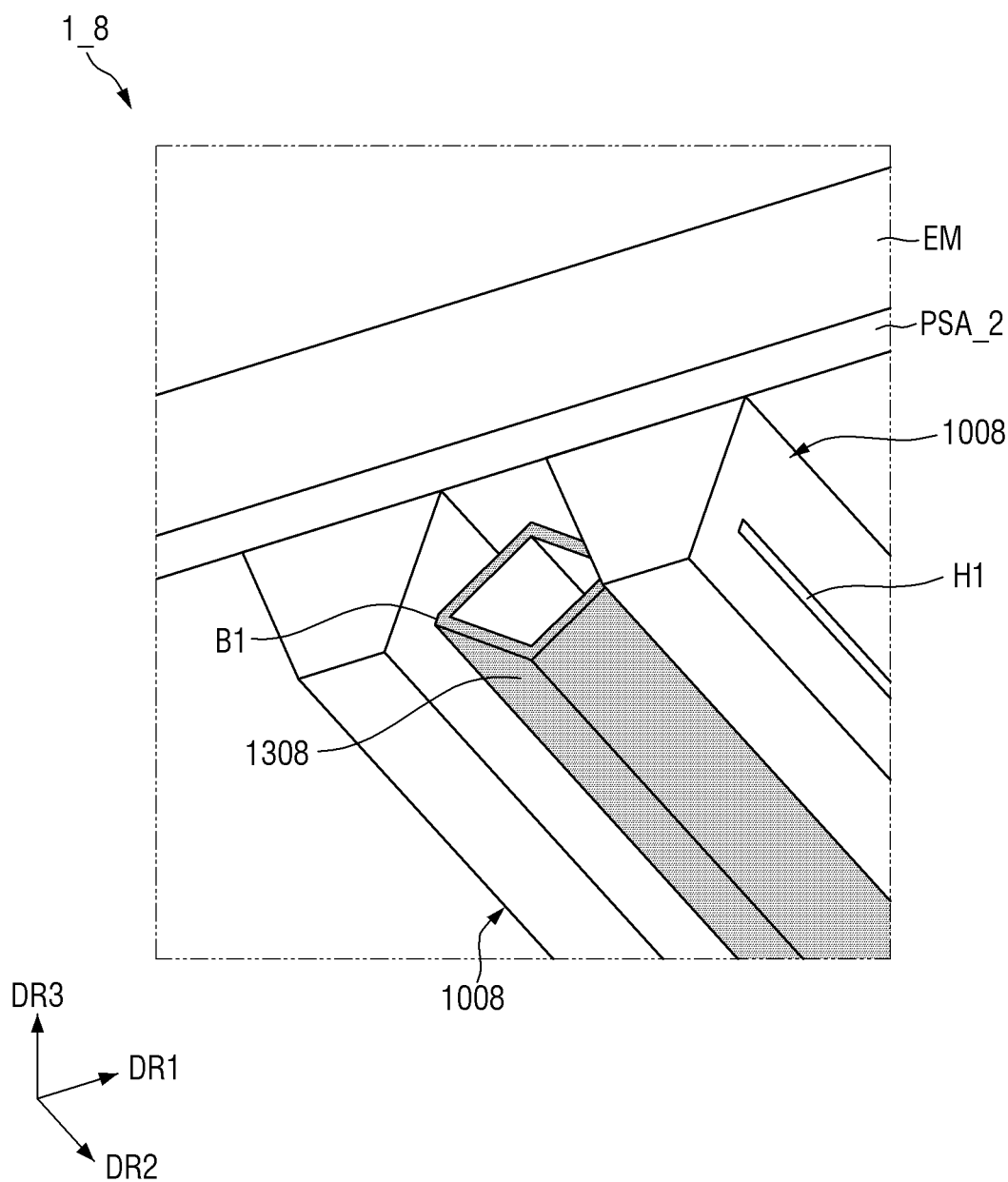
FIG. 28 is a schematic perspective view showing a spacer disposed between adjacent joints in a display device according to an embodiment of the disclosure.

FIG. 28 is a perspective view showing a spacer disposed between adjacent joints in a display device according to an embodiment of the disclosure.

A display device 1_8 according to the embodiment of FIG. 28 is different from the display device 1_7 according to the embodiment of FIG. 27 in that the length of a spacer 1308 in the second direction DR2 may be smaller than the length of each of the joints 1008 in the second direction DR2, and that a blocking portion B1 may be further included on two inclined surfaces of each of the joints 1008 in addition to the grooves H1.

Grooves H1 may be formed in two inclined surfaces of a joint 1008 and may be extended in the second direction DR2 as shown in FIG. 28, and the length of the grooves H1 may be substantially equal to the length of the spacer 1308. A space that is bent toward the inside of the joints 1008 are formed in the inclined surfaces of the joints 1008 where the grooves H1 are extended. A space may not be formed at the end of the grooves H1, i.e., at the blocking portion B1 and thus the intact inclined surfaces of the joints 1008 may be formed. Accordingly, according to this embodiment, the spacer 1308 may be fitted into the grooves H1 and also blocked by the blocking portion B1, the spacer 1308 may be more stably fitted between the adj acent joints 1008.

Figure 29:
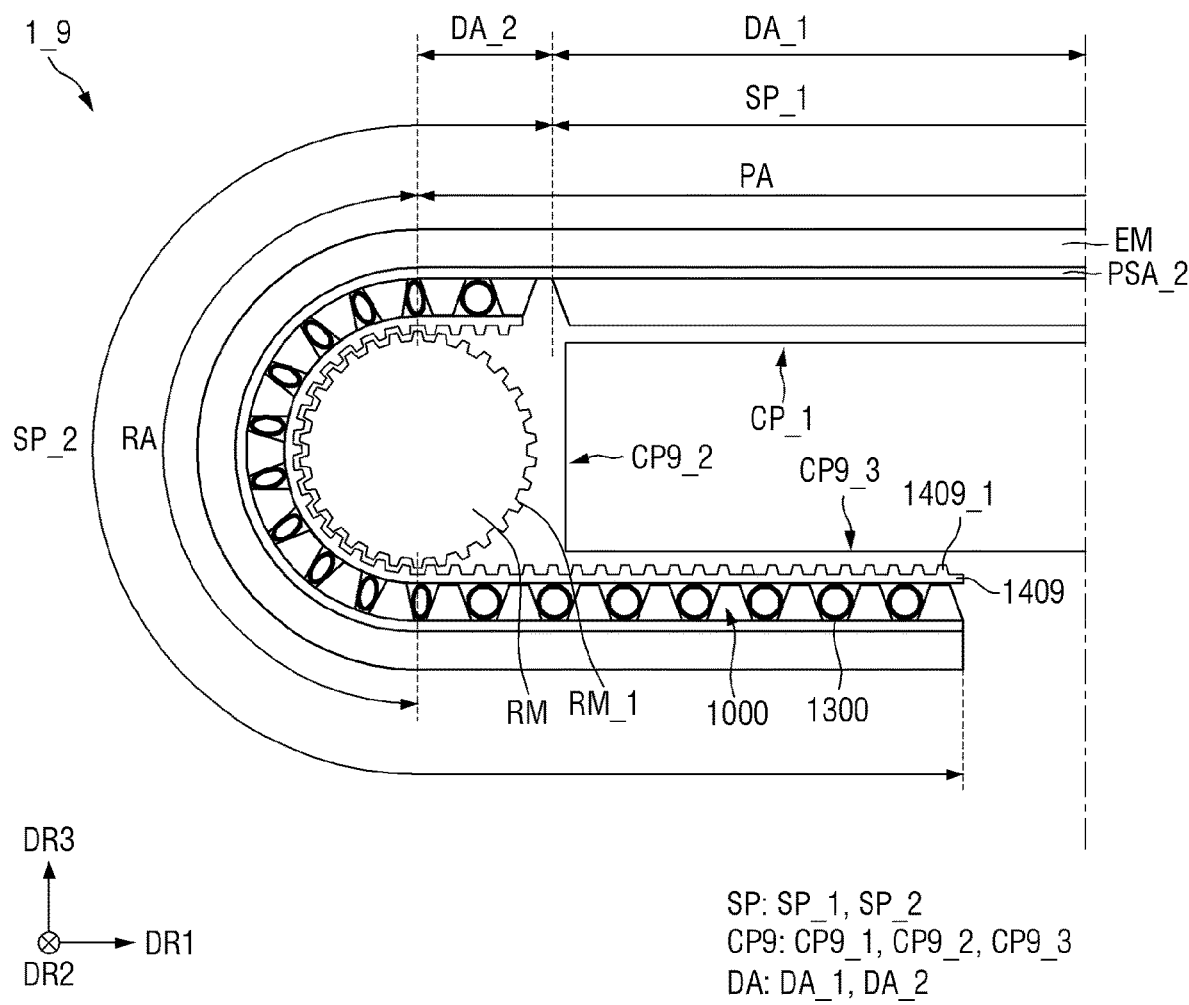
FIG. 29 is a schematic view showing an internal structure of a display device according to an embodiment of the disclosure.

FIG. 29 is a plan view showing an internal structure of a display device according to an embodiment of the disclosure.

A display device 1_9 according to the embodiment of FIG. 29 is different from the display device 1_2 according to the embodiment of FIG. 20 in that the former further includes a roller RM, that spacer sealing-member teeth 1409_1 are formed on a surface of a space sealing member 1409, and that the shape of a panel driving module CP9 is a hexahedron having six flat surfaces.

The panel driving module CP9 of the display device 1_9 according to this embodiment may be a component that provides a driving signal to the display panel PNL and supplies power to the display device 1_9. The panel driving module CP9 according to this embodiment may have a three-dimensional shape in which all surfaces may be flat. The panel driving module CP9 may include a front portion CP9_1 having a flat surface and disposed on a side in the third direction DR3, and a rear portion CP9_3 having a flat surface and disposed on the opposite side in the third direction DR3, as well as a connection portion CP9_2 having a flat surface and disposed on the opposite side in the first direction DR1. The front portion CP9_1 and the rear portion CP9_3 may face each other, and the connection portion CP9_2 may connect the front portion CP9_1 with the rear portion CP9_3.

The roller RM according to this embodiment may assist the display panel PNL to slide stably. As shown in FIG. 29, the roller RM according to this embodiment is disposed adjacent to the panel driving module CP9 in the space between the display panel PNL and the panel driving module CP9 inside the panel storage SD. Although not shown in the drawings, it may be connected to the panel driving module CP9 by a connection member or may be disposed in the round area RA by forming a shaft on the side wall SD_2 of the panel storage SD. The roller RM may have a circular cross section and a cylindrical shape extending in the second direction DR2. A part of the roller RM may be disposed in the round area RA such that it conforms to the bent shape of the display panel PNL in the rear wall SD_1 of the panel storage SD.

The roller RM may include fine teeth RM_1 formed at selected intervals on the surface of the roller RM. The surface of the spacer sealing member 1402 that faces the roller RM may further include spacer sealing member teeth 1409_1 which are engaged with the fine teeth RM_1 of the roller RM and formed at selected intervals on the surface of the spacer sealing member to be arranged side by side in the first direction. As the fine teeth RM_1 of the roller RM are engaged with the spacer sealing member teeth 1409_1, the display panel PNL may slide more stably.

Figure 30:
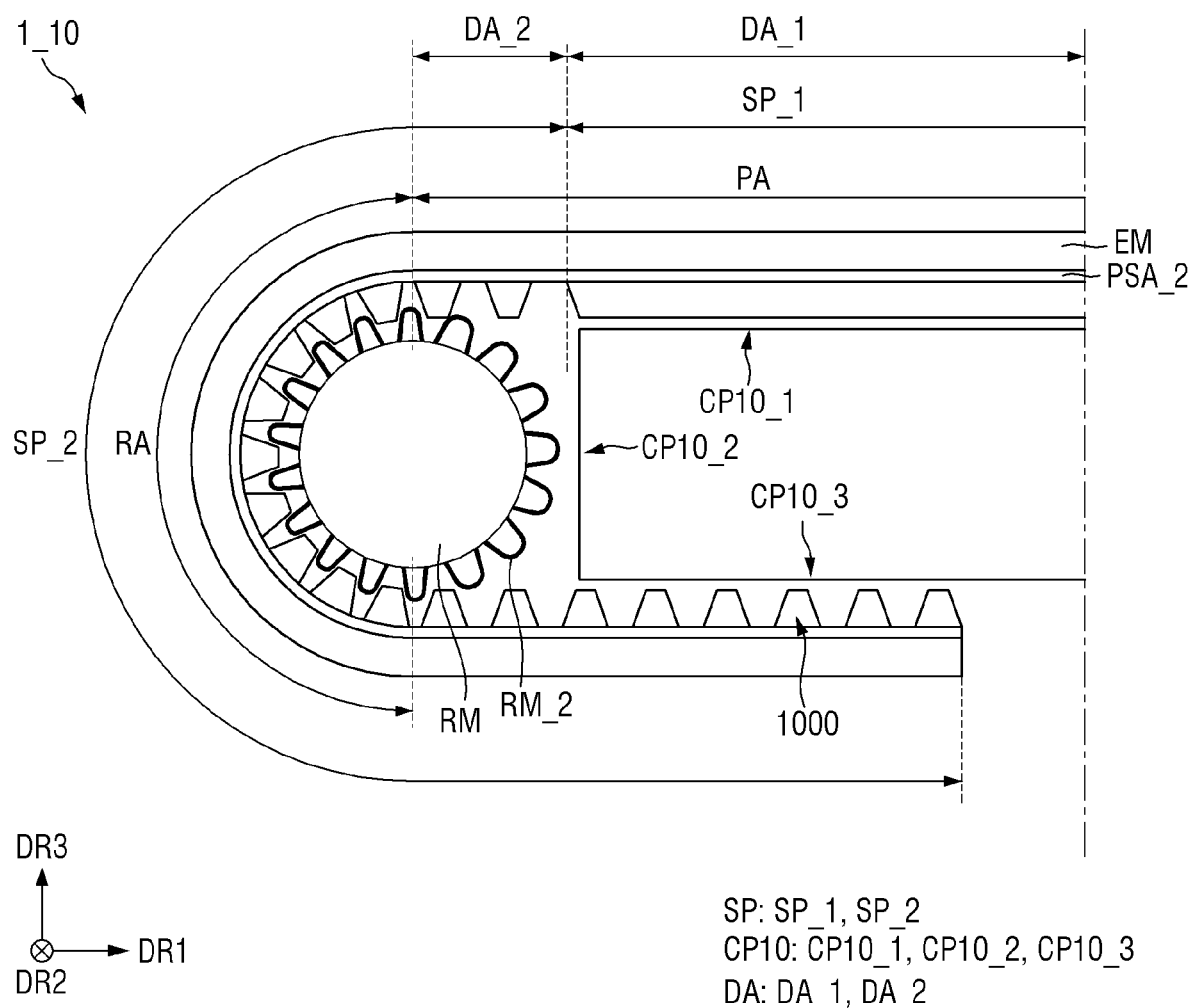
FIG. 30 is a schematic view showing an internal structure of a display device according to an embodiment of the disclosure.

FIG. 30 is a plan view showing an internal structure of a display device according to an embodiment of the disclosure.

A display device 1_10 according to the embodiment of FIG. 30 is different from the display device 1 according to the embodiment of FIG. 1 in that the spacers 1300 and the spacer sealing member 1402 are eliminated, that a roller RM including hollow teeth RM_2 is included, and that the shape of the panel driving module CP10 is different.

The panel driving module CP10 of the display device 1_10 according to this embodiment may be a component that provides a driving signal to the display panel PNL and supplies power to the display device 1_10. The panel driving module CP9 according to this embodiment may have a three-dimensional shape in which all surfaces may be flat. The panel driving module CP10 may include a front portion CP10_1 having a flat surface and disposed on one side in the third direction DR3, and a rear portion CP10_3 having a flat surface and disposed on the opposite side in the third direction DR3, as well as a connection portion CP_2 having a flat surface and disposed on the opposite side in the first direction DR1. The front portion CP_1 and the rear portion CP_3 may face each other, and the connection portion CP10_2 may connect the front portion CP10_1 with the rear portion CP10_3.

The roller RM according to the embodiment may maintain the joints 1000 at equal spacing in the round area RA and may assist the sliding movement of the display panel PNL. As shown in FIG. 30, the roller RM according to this embodiment is disposed adjacent to the panel driving module CP10 in the space between the display panel PNL and the panel driving module CP10 inside the panel storage SD. Although not shown in the drawings, it may be connected to the panel driving module CP10 by a connection member or may be disposed in the round area RA by forming a shaft on the side wall SD_2 of the panel storage SD. The roller RM may be formed in a cylindrical shape having circular cross section. A part of the roller RM may be disposed in the round area RA such that it conforms to the bent shape of the display panel PNL in the rear wall SD_1 of the panel storage SD. The roller RM may include hollow-tube-shaped teeth, which are arranged at selected intervals on the surface and have an empty inner space to engage between the joints 1000 of the second support member SP_2, i.e., hollow teeth RM_2.

The hollow teeth RM_2 may serve as spacers for maintaining uniform spacing between the joints 1000 in the round area RA. In the round area RA in which the roller RM is disposed, the hollow teeth RM_2 may be disposed between adjacent joints 1000, while the space between the adjacent joints 1000 may be empty in the plane area PA in which the roller RM is not disposed. As shown in FIG. 30, the hollow teeth RM_2 may have a semicircular cross-section in which both ends are attached to the roller RM, but the disclosure is not limited thereto.

As described above, as the display panel PNL is bent in the round area RA, the distance between the adjacent joints 1000 of the second support member SP_2 may become narrower. As a result, the hollow teeth RM_2 cannot maintain its original shape but may be crushed. However, the hollow teeth RM_2 are not completely crushed due to its own elastic modulus, and thus the minimum distance between the adjacent joints 1000 may be maintained in the round area RA. In this manner, it is possible to suppress the elongation of the second adhesive member PSA_2.

The elastic modulus of the hollow teeth RM_2 may be greater than about 2 MPa and less than about 3 GPa. When the elastic modulus of the hollow teeth RM_2 exceeds about 2 MPa, it is possible to prevent that the hollow teeth RM_2 are completely crushed in the round area RA. When the elastic modulus of the hollow teeth RM_2 is less than about 3 GPa, the display panel PNL may be bent appropriately in the round area RA to facilitate the sliding operation, and it is also possible to prevent excessive stress from being applied to the display panel due to the bending resistance. Examples of the material for the hollow teeth RM_2 may include, but is not limited to, at least one of a polymer such as polyurethane, synthetic rubber, and acrylic polymer.

The elastic modulus of the hollow teeth RM_2 may have a smaller value than the elastic modulus of the elastic member EM. When the elastic modulus of the hollow teeth RM_2 is smaller than the elastic modulus of the elastic member EM, the restoring force of the hollow teeth RM_2 does not change a strain on the elastic member EM, and thus it is possible to prevent the display panel PNL from being defective due to a change in the strain on the elastic member EM.

In this manner, the display device 1_10 according to this embodiment does not require a large number of spacers 1300, and it is not necessary to include the spacer sealing member 1402, thereby making it easier to fabricate display devices.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a display panel comprising:
      a first area; and
      a second area comprising a first end corresponding to an end of the display panel and a second end opposite the first end in a first direction, the second area located on a side of the first area in the first direction;
   a panel storage that accommodates the display panel therein; and
   a support module that supports a bottom of the display panel and assists a sliding operation of the display panel in the first direction, wherein a portion of the second area between the first end and the second end is bent,
   wherein the support module comprises:
      a first support member overlapping the first area; and
      a second support member overlapping the second area, the second support member comprising:
         joints spaced apart from each other and comprising first surfaces attached to the display panel and second surfaces opposite the first surfaces, the second surfaces having a narrower width than the first surfaces; and
         spacers having an elastic modulus and disposed between the joints.

2. The display device of claim 1, wherein the joints comprise:
   fixed ends attached to the bottom of the display panel; and
   free ends opposite to the fixed ends and not attached to the bottom of the display panel,
   the fixed ends are spaced apart from each other at regular intervals, and
   the free ends are spaced apart from each other at regular intervals.

3. The display device of claim 2, wherein
   each of the joints extends in a second direction intersecting the first direction,
   a length of the spacers is equal to a length of the joints in the second direction, and
   the spacers are formed as a hollow tube having a circular cross section.

4. The display device of claim 3, wherein the spacers include at least one of polyurethane, synthetic rubber, and acrylic polymer.

5. The display device of claim 4, wherein an elastic modulus of the spacer is in a range greater than about 2 MPa and less than about 3 GPa.

6. The display device of claim 2, further comprising:
a spacer sealing member contacting the free ends and overlapping the display panel, wherein
the spacer sealing member and the joints form housings, each of the housings being a space between the spacer sealing member and adjacent ones of the joints, and
the spacers are disposed in the housings.

7. The display device of claim 6, wherein an elastic modulus of the spacer sealing member is smaller than an elastic modulus of the spacer.

8. The display device of claim 7, wherein an elastic modulus of the spacer sealing member is less than about 2 GPa.

9. The display device of claim 1, wherein
each of the joints extends in a second direction intersecting the first direction, and
a length of the spacers is equal to or greater than half of a length of the joints in the second direction, and is less than the length of the joints in the second direction.

10. The display device of claim 9, wherein the spacers are disposed in a middle portion of the joints in the second direction.

11. The display device of claim 1, wherein
the display panel further comprises:
a third area disposed on a side of the first area in the first direction; and
a subsidiary area disposed at an end of the first area on a side in a second direction intersecting the first direction,
the first area is disposed between the second area and the third area,
a driving circuit and a circuit board are disposed on the subsidiary area,
the support module further comprises a third support member overlapping the third area, and
the third support member comprises:
joints spaced apart from each other; and
spacers disposed between the joints and having an elastic modulus.

12. The display device of claim 1, wherein
the support module comprises:
an elastic member disposed between the display panel and the support module;
a first adhesive member interposed between the display panel and the elastic member, the first adhesive member attaching the display panel to the elastic member; and
a second adhesive member interposed between the elastic member and the first support member and between the elastic member and the second support member, the second adhesive member attaching the elastic member to the first support member, and attaching the elastic member to the second support member.

13. The display device of claim 12, wherein an elastic modulus of the elastic member is greater than the elastic modulus of the spacer.

14. The display device of claim 1, wherein
the first end of the second area overlaps a portion of the first area when the portion of the second area between the first end and the second end is bent.

15. A display device comprising:
a display panel comprising:
a rigid area; and
a bendable area comprising a first end corresponding to an end of the display panel and a second end opposite the first end in a first direction, the bendable area disposed adjacent to the rigid area in the first direction;
joints overlapping the bendable area and comprising first surfaces attached to a bottom of the display panel and second surfaces opposite the first surfaces, each of the joints extending in a second direction intersecting the first direction and spaced apart from each other, wherein the second surfaces have a narrower width than the first surfaces; and
spacers disposed on the bottom of the display panel, wherein
one or more of the spacers are disposed between adjacent ones of the joints.

16. The display device of claim 15, further comprising:
a plane area;
a round area disposed on a side of the plane area; and
a panel storage overlapping at least a part of the plane area and at least a part of the round area, wherein
the panel storage accommodates the display panel, the joints, and the spacers,
the rigid area of the display panel is disposed on the plane area of the display device,
at least a part of the bendable area of the display panel is disposed in the round area to be bent,
a distance between the adjacent ones of the joints overlapping the bendable area is reduced in case that the bendable area is bent, and
the adjacent ones of the joints are spaced apart from each other by the one or more of the spacers disposed between the adjacent ones of the joints.

17. The display device of claim 16, wherein
a part of the bendable area of the display panel is disposed in the plane area of the display device, and
the bendable area disposed in the plane area of the display device is flattened by the spacers.

18. The display device of claim 15, wherein
a sum of lengths in the second direction of the one or more of the spacers disposed between the adjacent ones of the joints is equal to or greater than a half of a length in the second direction of the joints, and
the sum of lengths in the second direction of the one or more of the spacers and is equal to or less than the length in the second direction of the joints.

19. The display device of claim 15, wherein
the joints further comprise inclined surfaces extending from the first surfaces to the second surfaces, and
the one or more of the spacers directly contact two of the inclined surfaces facing each other between the adjacent ones of the joints.

20. The display device of claim 15, wherein
the first end of the bendable area, two or more of the joints, and/or more of the spacers overlap a portion of the rigid area when a portion of the bendable area between the first end and the second end is bent.

21. The display device of claim 15, wherein the spacers are formed as having a circular cross section in the second direction.

22. A display device comprising:
a display panel comprising a bendable area at a first end of the display panel;
joints attached to a bottom surface of the bendable area of the display panel and spaced apart from each other in a first direction; and
a hollow tube disposed between the joints and extending in a second direction intersecting the first direction.

23. The display device of claim 22, wherein
the joints are spaced apart from each other by a first spacing,
the hollow tube has a cylindrical shape and has a circular cross-section in the second direction, and
a diameter of the circular cross-section of the hollow tube is greater than the first spacing.

24. The display device of claim 23, wherein the hollow tube includes at least one of polyurethane, synthetic rubber, and acrylic polymer.

* * * * *